United States Patent
Dutta et al.

(10) Patent No.: US 8,051,240 B2
(45) Date of Patent: Nov. 1, 2011

(54) COMPENSATING NON-VOLATILE STORAGE USING DIFFERENT PASS VOLTAGES DURING PROGRAM-VERIFY AND READ

(75) Inventors: Deepanshu Dutta, Santa Clara, CA (US); Jeffrey W. Lutze, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 777 days.

(21) Appl. No.: 12/118,446

(22) Filed: May 9, 2008

(65) Prior Publication Data

US 2009/0282184 A1    Nov. 12, 2009

(51) Int. Cl.
G06F 12/00    (2006.01)
(52) U.S. Cl. ........................................................ 711/103
(58) Field of Classification Search .................. None
See application file for complete search history.

(56) References Cited

U.S. PATENT DOCUMENTS

| | | | |
|---|---|---|---|
| 5,386,422 A | 1/1995 | Endoh et al. | |
| 5,570,315 A | 10/1996 | Tanaka et al. | |
| 5,774,397 A | 6/1998 | Endoh et al. | |
| 6,046,935 A | 4/2000 | Takeuchi et al. | |
| 6,222,762 B1 | 4/2001 | Guterman et al. | |
| 6,330,189 B1 | 12/2001 | Sakui et al. | |
| 6,456,528 B1 | 9/2002 | Chen | |
| 6,522,580 B2 | 2/2003 | Chen et al. | |
| 6,859,397 B2 | 2/2005 | Lutze et al. | |
| 6,917,542 B2 | 7/2005 | Chen et al. | |
| 7,009,881 B2 | 3/2006 | Noguchi | |
| 7,023,736 B2 | 4/2006 | Cernea et al. | |
| 7,046,568 B2 | 5/2006 | Cernea | |
| 7,120,051 B2 | 10/2006 | Gorobets et al. | |
| 7,196,928 B2 | 3/2007 | Chen | |
| 7,196,931 B2 | 3/2007 | Cernea et al. | |
| 7,237,074 B2 | 6/2007 | Guterman et al. | |

(Continued)

FOREIGN PATENT DOCUMENTS

WO    2007130556    11/2007

OTHER PUBLICATIONS

Notification Concerning Transmittal of International Preliminary Report on Patentability dated Nov. 18, 2010, International Application No. PCT/US2009/042564 filed May 1, 2009.

(Continued)

*Primary Examiner* — Hiep Nguyen

(74) *Attorney, Agent, or Firm* — Vierra Magen Marcus & DeNiro LLP

(57) ABSTRACT

Optimized verify and read pass voltages are obtained to improve read accuracy in a non-volatile storage device. The optimized voltages account for changes in unselected storage element resistance when the storage elements become programmed. This change in resistance is referred to as a front pattern effect. In one approach, the verify pass voltage is higher than the read pass voltage, and a common verify voltage is applied on the source and drain sides of a selected word line. In other approaches, different verify pass voltages are applied on the source and drain sides of the selected word line. An optimization process can include determining a metric for different sets of verify and read pass voltages. The metric can indicate threshold voltage width, read errors or a decoding time or number of iterations of an ECC decoding engine.

18 Claims, 16 Drawing Sheets

U.S. PATENT DOCUMENTS

| | | |
|---|---|---|
| 7,310,272 B1 | 12/2007 | Mokhlesi et al. |
| 7,327,619 B2 | 2/2008 | Chan et al. |
| 7,492,633 B2 * | 2/2009 | Mokhlesi ................. 365/185.02 |
| 7,545,675 B2 * | 6/2009 | Kamei ..................... 365/185.18 |
| 2006/0140007 A1 | 6/2006 | Cernea et al. |
| 2007/0140006 A1 | 6/2007 | Chen et al. |
| 2007/0279993 A1 | 12/2007 | Hemink |
| 2008/0316818 A1 | 12/2008 | Park |

OTHER PUBLICATIONS

Notification of Transmittal of the International Search Report and the Written Opinion of the International Searching Authority, or the Declaration, dated Nov. 6, 2009, for International Application No. PCT/US2009/042564 filed May 1, 2009.

Amendment dated Jan. 2010 in Taiwanese Patent Application No. 098115455 filed May 8, 2009.

* cited by examiner

Metric

830

Optimization point $\Delta V = V_{PASS-V} - V_{PASS-R}$

| | Verify voltages: | | Read voltages: |
|---|---|---|---|
| Drain side unselected WLs: | $V_{PASS-V-HIGH}$ | > | $V_{PASS-R}$ |
| Selected WL: | $V_{CG-V}$ | | $V_{CG-R}$ |
| Source side unselected WLs: | $V_{PASS-V-HIGH}$ | > | $V_{PASS-R}$ |

Fig. 9b

| | Verify voltages: | | Read voltages: |
|---|---|---|---|
| Drain side unselected WLs: | $V_{PASS-V-LOW}$ | = | $V_{PASS-R}$ |
| Selected WL: | $V_{CG-V}$ | | $V_{CG-R}$ |
| Source side unselected WLs: | $V_{PASS-V-HIGH}$ | > | $V_{PASS-R}$ |

Fig. 9c

| | Verify voltages: | | Read voltages: |
|---|---|---|---|
| Drain side unselected WLs: | $V_{DD}$ | < | $V_{PASS-R}$ |
| Selected WL: | $V_{CG-V}$ | | $V_{CG-R}$ |
| Source side unselected WLs: | $V_{PASS-V-HIGH}$ | > | $V_{PASS-R}$ |

Fig. 9d

| | Verify voltages: | | Read voltages: |
|---|---|---|---|
| Other drain side unselected WLs: | $V_{PASS-V-HIGH}$ | > | $V_{PASS-R}$ |
| WLn+1: | $V_{PASS-V}$ | = | $V_{PASS-R}$ |
| Selected WLn: | $V_{CG-V}$ | | $V_{CG-R}$ |
| WLn-1: | $V_{PASS-V}$ | = | $V_{PASS-R}$ |
| Other source side unselected WLs: | $V_{PASS-V-HIGH}$ | > | $V_{PASS-R}$ |

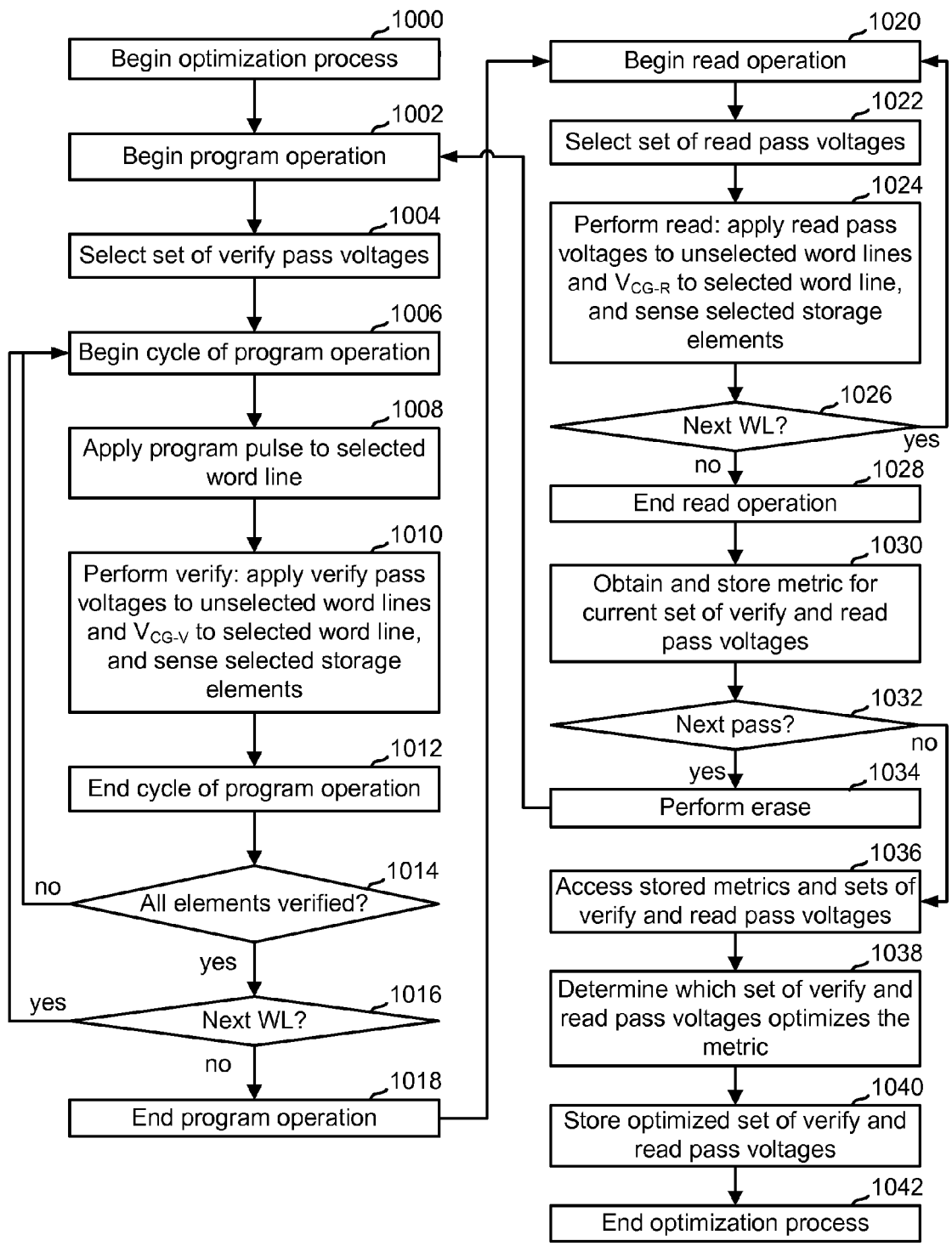

COMPENSATING NON-VOLATILE STORAGE USING DIFFERENT PASS VOLTAGES DURING PROGRAM-VERIFY AND READ

BACKGROUND OF THE INVENTION

1. Field of the Invention

The present invention relates to non-volatile memory.

2. Description of the Related Art

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage ($V_{TH}$) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Typically, a program voltage $V_{PGM}$ applied to the control gate during a program operation is applied as a series of pulses that increase in magnitude over time. In one possible approach, the magnitude of the pulses is increased with each successive pulse by a predetermined step size, e.g., 0.2-0.4 V. $V_{PGM}$ can be applied to the control gates of flash memory elements. In the periods between the program pulses, verify operations are carried out. That is, the programming level of each element of a group of elements being programmed in parallel is read between successive programming pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically $V_{PGM}$ is applied to the control gate and the bit line is grounded, causing electrons from the channel of a cell or memory element, e.g., storage element, to be injected into the floating gate. When electrons accumulate in the floating gate, the floating gate becomes negatively charged and the threshold voltage of the memory element is raised so that the memory element is considered to be in a programmed state. More information about such programming can be found in U.S. Pat. No. 6,859,397, titled "Source Side Self Boosting Technique For Non-Volatile Memory," and in U.S. Pat. No. 6,917,542, titled "Detecting Over Programmed Memory," issued Jul. 12, 2005; both of which are incorporated herein by reference in their entirety.

One issue which continues to be problematic is read accuracy. The read process must be accurate so that data can be read back with high fidelity. For example, multi-level devices which place threshold voltage ranges close together leave little room for error. Inaccuracies in reading a selected storage element can be caused by many variables, including the programmed data states of other, unselected storage elements. Accordingly, techniques which improved read accuracy are needed.

SUMMARY OF THE INVENTION

The present invention addresses the above and other issues by providing a method for improving read accuracy in non-volatile storage using different pass voltages during program-verify and read.

In one embodiment, a method for operating non-volatile storage includes programming at least one selected storage element in a set of storage elements, including performing a verify operation which involves applying a verify voltage to a control gate of the at least one selected storage element, while applying a first pass voltage to respective control gates of unselected storage elements which are connected in series with the at least one selected storage element and which are in an unprogrammed or only partly programmed state. The method further includes programming the unselected storage elements, and reading the at least one selected storage element, including applying a read compare voltage to the control gate of the at least one selected storage element while applying a second pass voltage, lower than the first pass voltage, to the unselected storage elements.

In another embodiment, a method for operating non-volatile storage includes programming at least one selected storage element in a set of storage elements, including performing a verify operation which involves applying a verify voltage to a control gate of the at least one selected storage element, while applying a first pass voltage to respective control gates of unselected storage elements which are connected in series with the at least one selected storage element and which are in a programmed state. The method further includes reading the at least one selected storage element, including applying a read compare voltage to the control gate of the at least one selected storage element while applying a second pass voltage, lower than the first pass voltage, to the unselected storage elements.

In another embodiment, a method for operating non-volatile storage includes programming a first selected storage element in a NAND string, including performing a verify operation which involves applying a verify voltage to a control gate of the first selected storage element, while applying a first common pass voltage to respective control gates of unselected storage elements in the NAND string on source and drain sides of the first selected storage element. The method further includes subsequently programming a second selected storage element in the NAND string, including performing a verify operation which involves applying a verify voltage to a control gate of the second selected storage element, while applying the first common pass voltage to respective control gates of unselected storage elements in the NAND string on source and drain sides of the second selected storage element. The method further includes reading the first selected storage element, including applying a read compare voltage to the control gate of the first selected storage element while applying a second common pass voltage, lower than the first common pass voltage, to respective control gates of unselected storage elements in the NAND string on source and drain sides of the first selected storage element. The method further includes reading the second selected storage element, including applying a read compare voltage to the control gate of the second selected storage element while applying the second common pass voltage to respective control gates of unselected storage elements in the NAND string on source and drain sides of the second selected storage element.

Corresponding methods, systems and computer- or processor-readable storage devices for performing the methods provided herein may also be provided.

BRIEF DESCRIPTION OF THE DRAWINGS

FIG. 9b depicts a second option for verify and read voltages.

FIG. 9c depicts a third option for verify and read voltages.

FIG. 9d depicts a fourth option for verify and read voltages.

FIG. 10a depicts an optimization process for determining optimum verify and read voltages for a set of storage elements.

DETAILED DESCRIPTION

The present invention provides a method and non-volatile storage system in which program disturb is reduced.

Figure 1:
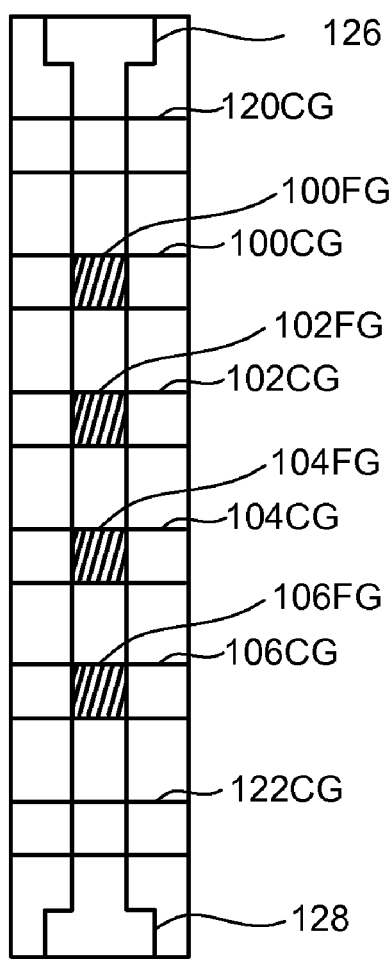
FIG. 1 is a top view of a NAND string.
Figure 2:
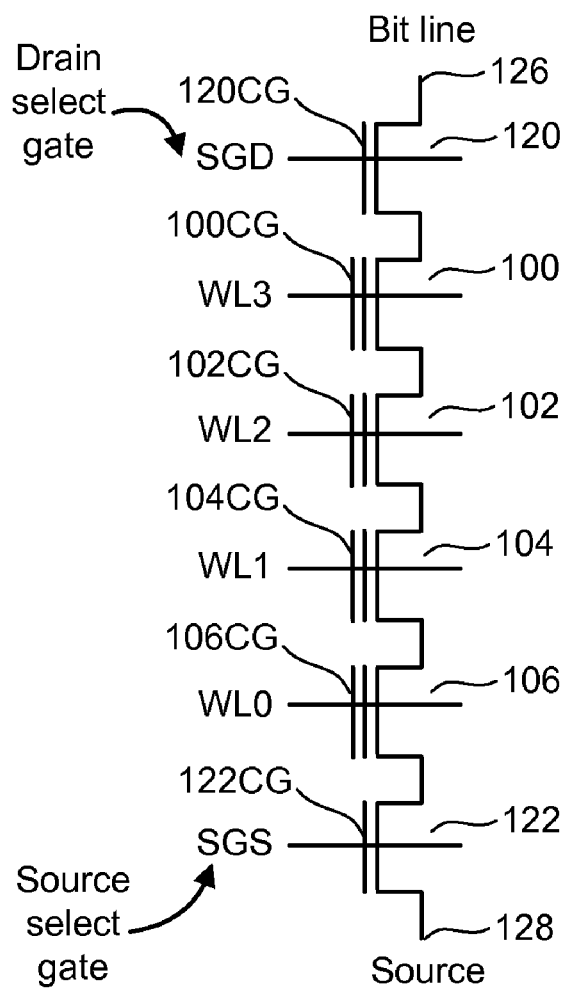
FIG. 2 is an equivalent circuit diagram of the NAND string of FIG. 1.

One example of a memory system suitable for implementing the present invention uses the NAND flash memory structure, which includes arranging multiple transistors in series between two select gates. The transistors connected in series and the select gates are referred to as a NAND string. FIG. 1 is a top view showing one NAND string. FIG. 2 is an equivalent circuit thereof. The NAND string depicted in FIGS. 1 and 2 includes four transistors, 100, 102, 104 and 106, in series and sandwiched between a first select gate 120 and a second select gate 122. Select gate 120 gates the NAND string connection to bit line 126. Select gate 122 gates the NAND string connection to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to (or is) word line WL3, control gate 102CG is connected to word line WL2, control gate 104CG is connected to word line WL1, and control gate 106CG is connected to word line WL0. In one embodiment, transistors 100, 102, 104 and 106 are each storage elements, also referred to as memory cells. In other embodiments, the storage elements may include multiple transistors or may be different than that depicted in FIGS. 1 and 2. Select gate 120 is connected to select line SGD. Select gate 122 is connected to select line SGS.

Figure 3:
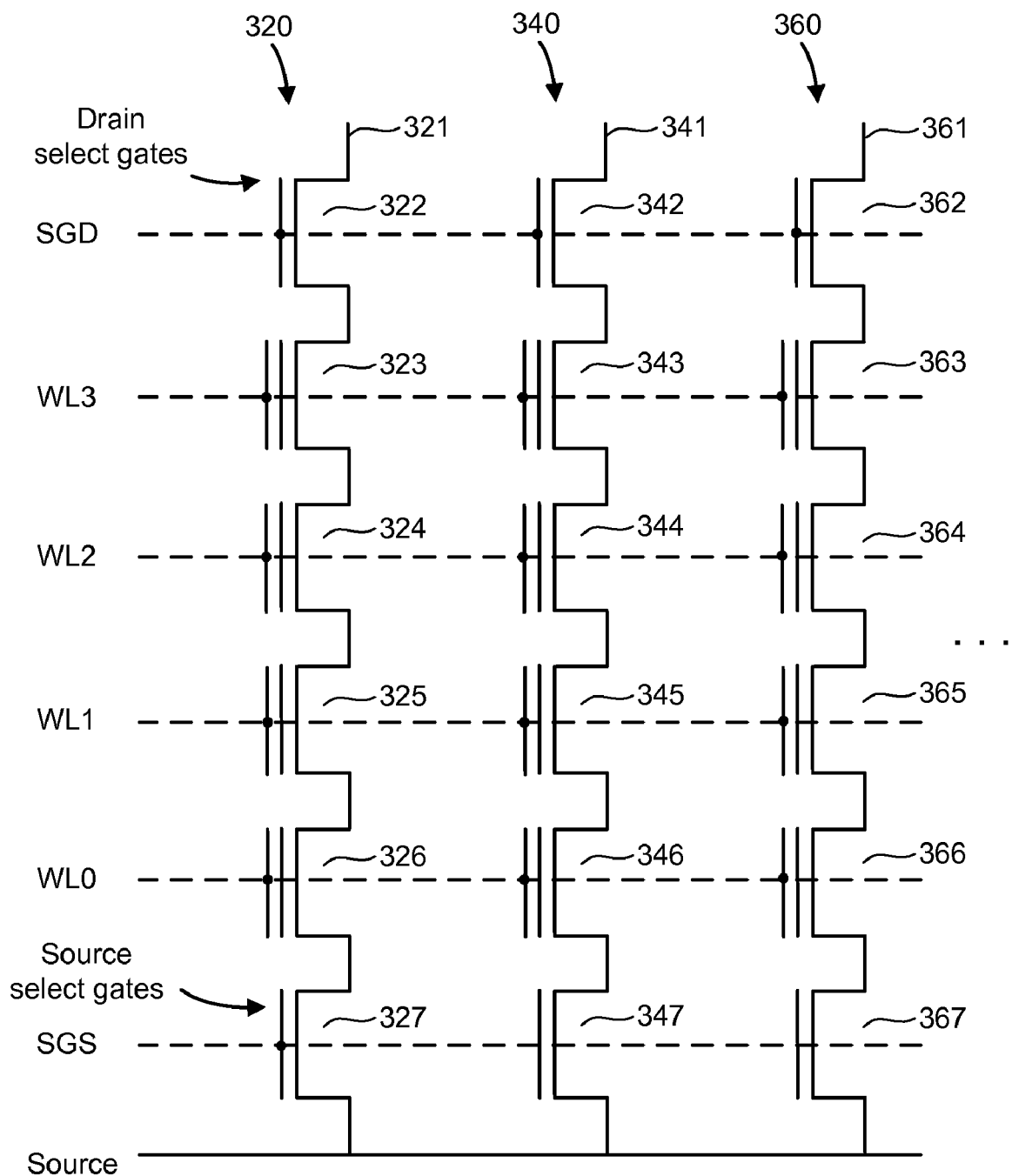
FIG. 3 is a block diagram of an array of NAND flash storage elements.

FIG. 3 is a circuit diagram depicting three NAND strings. A typical architecture for a flash memory system using a NAND structure will include several NAND strings. For example, three NAND strings 320, 340 and 360 are shown in a memory array having many more NAND strings. Each of the NAND strings includes two select gates and four storage elements. While four storage elements are illustrated for simplicity, modern NAND strings can have up to thirty-two or sixty-four storage elements, for instance.

For example, NAND string 320 includes select gates 322 and 327, and storage elements 323-326, NAND string 340 includes select gates 342 and 347, and storage elements 343-346, NAND string 360 includes select gates 362 and 367, and storage elements 363-366. Each NAND string is connected to the source line by its select gates (e.g., select gates 327, 347 or 367). A selection line SGS is used to control the source side select gates. The various NAND strings 320, 340 and 360 are connected to respective bit lines 321, 341 and 361, by select transistors in the select gates 322, 342, 362, and so forth.

These select transistors are controlled by a drain select line SGD. In other embodiments, the select lines do not necessarily need to be in common among the NAND strings; that is, different select lines can be provided for different NAND strings. Word line WL3 is connected to the control gates for storage elements 323, 343 and 363. Word line WL2 is connected to the control gates for storage elements 324, 344 and 364. Word line WL1 is connected to the control gates for storage elements 325, 345 and 365. Word line WL0 is connected to the control gates for storage elements 326, 346 and 366. As can be seen, each bit line and the respective NAND string comprise the columns of the array or set of storage elements. The word lines (WL3, WL2, WL1 and WL0) comprise the rows of the array or set. Each word line connects the control gates of each storage element in the row. Or, the control gates may be provided by the word lines themselves. For example, word line WL2 provides the control gates for storage elements 324, 344 and 364. In practice, there can be thousands of storage elements on a word line.

Each storage element can store data. For example, when storing one bit of digital data, the range of possible threshold voltages ($V_{TH}$) of the storage element is divided into two ranges which are assigned logical data "1" and "0." In one example of a NAND type flash memory, the $V_{TH}$ is negative after the storage element is erased, and defined as logic "1." The $V_{TH}$ after a program operation is positive and defined as logic "0." When the $V_{TH}$ is negative and a read is attempted, the storage element will turn on to indicate logic "1" is being stored. When the $V_{TH}$ is positive and a read operation is attempted, the storage element will not turn on, which indicates that logic "0" is stored. A storage element can also store multiple levels of information, for example, multiple bits of digital data. In this case, the range of $V_{TH}$ value is divided into the number of levels of data. For example, if four levels of information are stored, there will be four $V_{TH}$ ranges assigned to the data values "11", "10", "01", and "00." In one example of a NAND type memory, the $V_{TH}$ after an erase operation is negative and defined as "11". Positive $V_{TH}$ values are used for the states of "10", "01", and "00." The specific relationship between the data programmed into the storage element and the threshold voltage ranges of the element depends upon the data encoding scheme adopted for the storage elements. For example, U.S. Pat. Nos. 6,222,762 and 7,237,074, both of which are incorporated herein by reference in their entirety, describe various data encoding schemes for multi-state flash storage elements.

Relevant examples of NAND type flash memories and their operation are provided in U.S. Pat. Nos. 5,386,422, 5,570,315, 5,774,397, 6,046,935, 6,456,528 and 6,522,580, each of which is incorporated herein by reference.

When programming a flash storage element, a program voltage is applied to the control gate of the storage element, and the bit line associated with the storage element is grounded. Electrons from the channel are injected into the floating gate. When electrons accumulate in the floating gate, the floating gate becomes negatively charged and the $V_{TH}$ of the storage element is raised. To apply the program voltage to the control gate of the storage element being programmed, that program voltage is applied on the appropriate word line. As discussed above, one storage element in each of the NAND strings share the same word line. For example, when programming storage element 324 of FIG. 3, the program voltage will also be applied to the control gates of storage elements 344 and 364.

However, program disturb can occur at inhibited NAND strings during programming of other NAND strings, and sometimes at the programmed NAND string itself. Program disturb occurs when the threshold voltage of an unselected non-volatile storage element is shifted due to programming of other non-volatile storage elements. Program disturb can occur on previously programmed storage elements as well as erased storage elements that have not yet been programmed. Various program disturb mechanisms can limit the available operating window for non-volatile storage devices such as NAND flash memory.

For example, if NAND string 320 is inhibited (e.g., it is an unselected NAND string which does not contain a storage element which is currently being programmed) and NAND string 340 is being programmed (e.g., it is a selected NAND string which contains a storage element which is currently being programmed), program disturb can occur at NAND string 320. For example, if a pass voltage, $V_{PASS}$, is low, the channel of the inhibited NAND string is not well boosted, and a selected word line of the unselected NAND string can be unintentionally programmed. In another possible scenario, the boosted voltage can be lowered by Gate Induced Drain Leakage (GIDL) or other leakage mechanisms, resulting in the same problem. Other effects, such as shifts in the $V_{TH}$ of a charge storage element due to capacitive coupling with other neighboring storage elements that are programmed later, can also contribute to program disturb.

Figure 4:
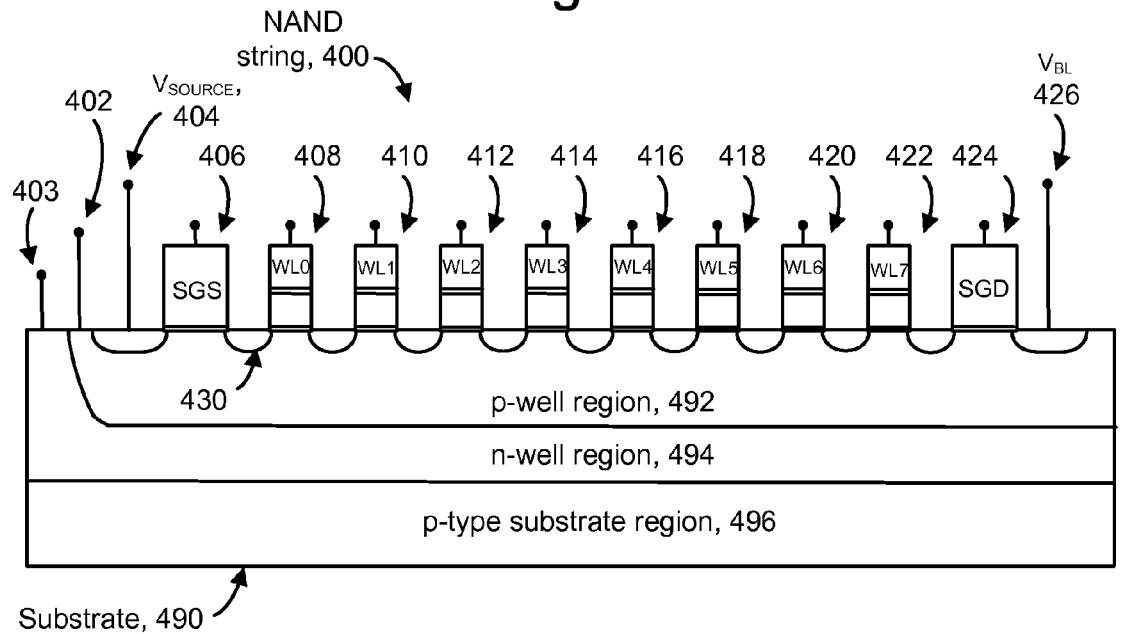
FIG. 4 depicts a cross-sectional view of a NAND string.

FIG. 4 depicts a cross-sectional view of a NAND string. The view is simplified and not to scale. The NAND string 400 includes a source-side select gate 406, a drain-side select gate 424, and eight storage elements 408, 410, 412, 414, 416, 418, 420 and 422, formed on a substrate 490. The components can be formed on a p-well region 492 which itself is formed in an n-well region 494 of the substrate. The n-well can in turn be formed in a p-substrate 496. Supply lines 402 and 403 may communicate with the p-well region 492 and n-well region 494, respectively. A source supply line 404 with a potential of $V_{SOURCE}$ is provided in addition to a bit line 426 with a potential of $V_{BL}$. $V_{SGS}$ is applied to the select gate 406 and $V_{SGD}$ is applied to the select gate 424. The source side of a word line or non-volatile storage element refers to the side which faces the source end of the NAND string, e.g., at source supply line 404, while the drain side of a word line or non-volatile storage element refers to the side which faces the drain end of the NAND string, e.g., at bit line 426.

Figure 5:
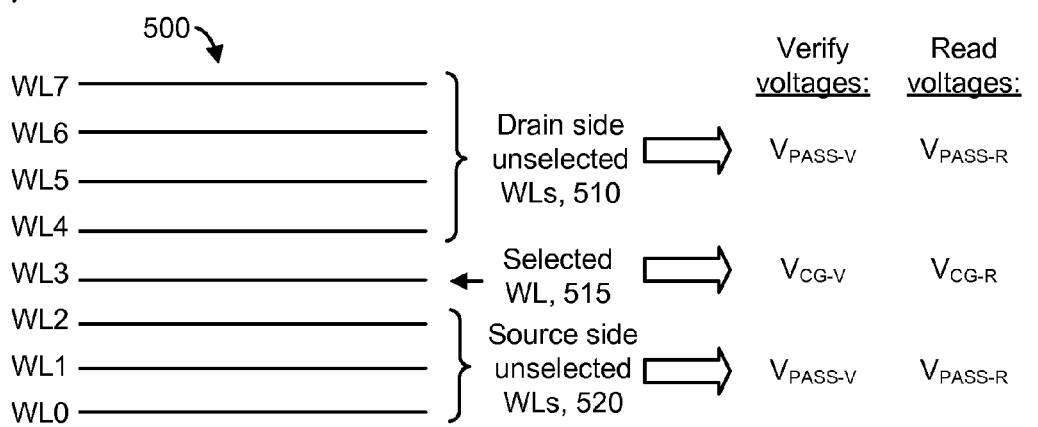
FIG. 5 depicts a set of word line and associate verify and read voltages.
Figure 16:
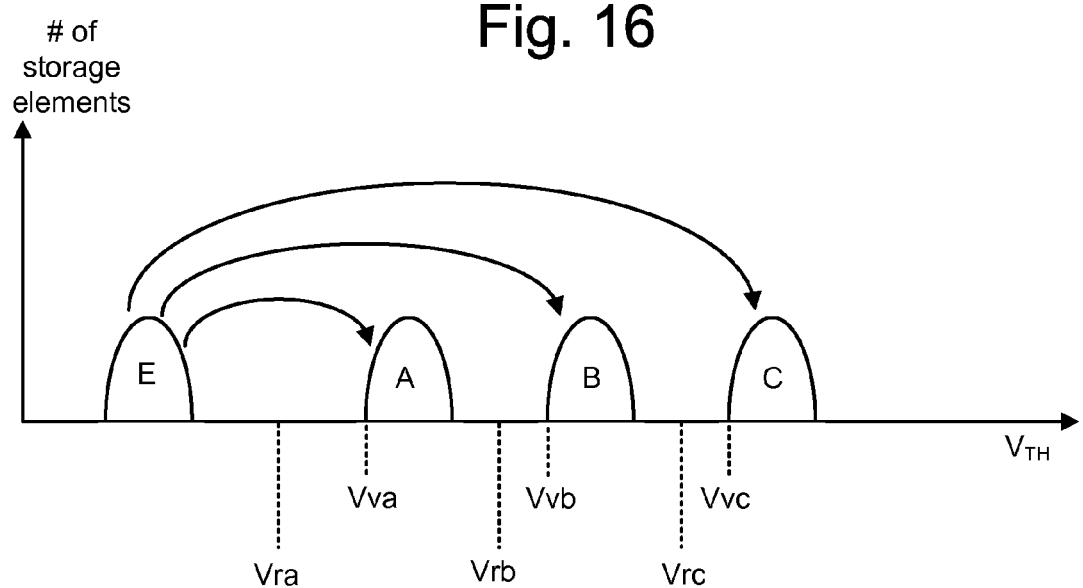
FIG. 16 depicts an example set of threshold voltage distributions and one-pass programming.

FIG. 5 depicts a set of word lines and associate verify and read voltages. An example set of word lines 500 includes eight word lines, WL0-WL7, where WL3 515 is the currently selected word line, WL0-WL2 are source side unselected word lines 520 and WL4-WL7 are drain side unselected word lines 510. Further, during the verify portion of a programming operation, a control gate verify voltage $V_{CG-V}$ is applied to the selected word line, while a verify pass voltage $V_{PASS-V}$ is applied to the source side unselected word lines 520 and the drain side unselected word lines 510. In practice, when different storage elements which are associated with a selected word line are being programmed to different states, $V_{CG-V}$ may be stepped to different levels (see also FIG. 20) and a sense operation performed for each selected storage element according to its intended programmed state. Thus, when there are four data states, three values of $V_{CG-V}$ may be used, e.g., Vva, Vvb and Vvc as depicted in FIG. 16.

After a set of storage elements has been programmed, the storage elements can be read to ascertain the programmed data. In this case, a control gate read voltage $V_{CG-R}$ is applied to the selected word line, while a read pass voltage $V_{PASS-R}$ is applied to the source side unselected word lines 520 and the drain side unselected word lines 510. The read pass voltage drives the unselected storage elements which are on same NAND string as the selected storage elements to a generally conductive state. In practice, when multi-level storage elements are used, $V_{CG-R}$ may be stepped to different levels and a sense operation performed for the selected storage element at each level. Thus, when there are four data states, three values of $V_{CG-R}$ may be used, e.g., Vra, Vrb and Vrc, as depicted in FIG. 16.

Generally, to program a memory block such as a NAND memory block, first the block is erased and then data is programmed in a sequential fashion, one word line at a time, starting form the lower word lines and proceeding to the higher word lines, e.g., from WL0 to WL7 in the set of word lines 500. Thus when the storage elements on the selected word line, WLn, are programmed, lower word lines (word lines below WLn: also called "source-side word lines") are in programmed states while the upper word lines (word lines above WLn: also called "drain-side word lines") are in the erased state. However, in most cases, when a user subsequently reads the data on WLn, the whole memory block has been programmed. In this case, for any storage element on WLn, during the read operation, the presence of programmed states on the drain-side storage elements in particular can raise the apparent threshold voltage of those storage elements from the value they were programmed to. This causes the drain side resistance to be higher for WLn during read as compared to verify. This effect is referred to as the "front-pattern-effect" since it is a result of data being programmed in front of a storage elements, on higher word lines, after the storage element undergoes program-verify operations.

Figure 6:
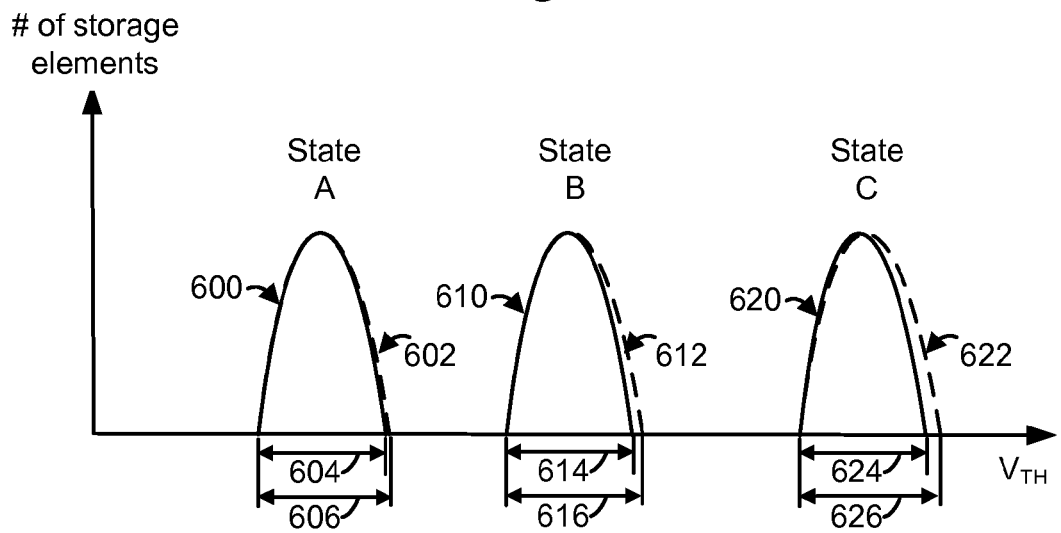
FIG. 6 depicts an apparent shift in threshold voltage distribution for programmed states.

See, e.g., FIG. 6, which depicts an apparent shift in threshold voltage distribution for programmed states. In particular, threshold voltage distributions for the programmed states A, B and C are widened and shifted higher. The erased state E is not depicted. The threshold voltage distributions at the time the storage elements were programmed is depicted by the solid lines 600, 610 and 620 for states A, B and C, respectively, while the threshold voltage distributions at the time the storage elements are subsequently read are depicted by the dashed lines 602, 612 and 622 for states A, B and C, respectively. Widths of the distributions at the time of programming are indicated by arrows 604, 614 and 624 for states A, B and C, respectively. The increased widths of the distributions at the time of reading are indicated by arrows 606, 616 and 626 for states A, B and C, respectively. In this example, the width is measured at the base of the distribution, but it may be measured in different ways, such as at half the height of a distribution, and so forth.

Further, since lower word lines have more programmed word lines above them than higher word lines, they are affected more by the front-pattern effect than the higher word lines. This is due to a higher resistance for the programmed storage elements, as explained below. Note that, in some cases, multi-pass programming is used in which the storage elements of some or all word lines are partially programmed to a first state in a first programming pass, and then programmed further to their final intended states in a second program pass. See, e.g., FIGS. 18a-c. The front-pattern-effect may still be present in such cases.

Figure 7:
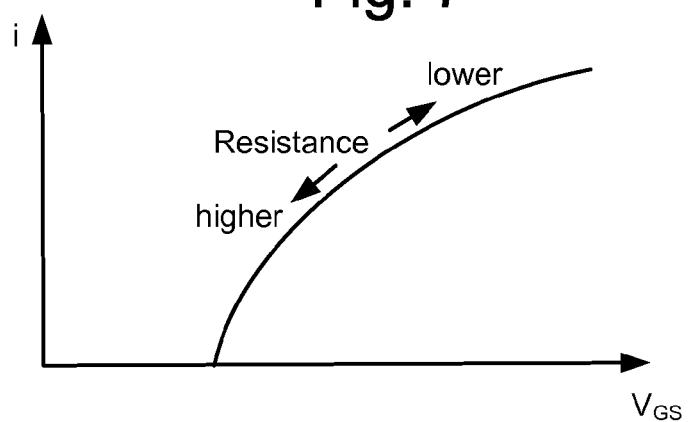
FIG. 7 depicts a change in current versus voltage for a storage element.

FIG. 7 depicts a change in current versus voltage for a storage element. The x-axis depicts a gate-to-source ($V_{GS}$) or gate-to-drain ($V_{GD}$) voltage of a storage element in a given data state, which is equal to the applied control gate voltage less the internal threshold voltage. The y-axis depicts current i through the storage element. With a given control gate voltage, a storage element having a higher threshold voltage, corresponding to a higher programmed state, will have a lower gate to source voltage and thus a higher resistance. The resistance is a function of the slope of the curve. Similarly, a storage element having a lower threshold voltage, corresponding to the erased state or a lower programmed state, will have a higher gate to source voltage and thus a lower resistance. Thus, during verify operations, the programmed storage elements which are on the source side of a selected storage element will have a higher resistance than unprogrammed storage elements which are on the drain side of the selected storage element. However, during read operations, the storage elements on the drain side of the selected storage element will also be programmed and have higher resistance than during the verify operation.

Figure 8A:
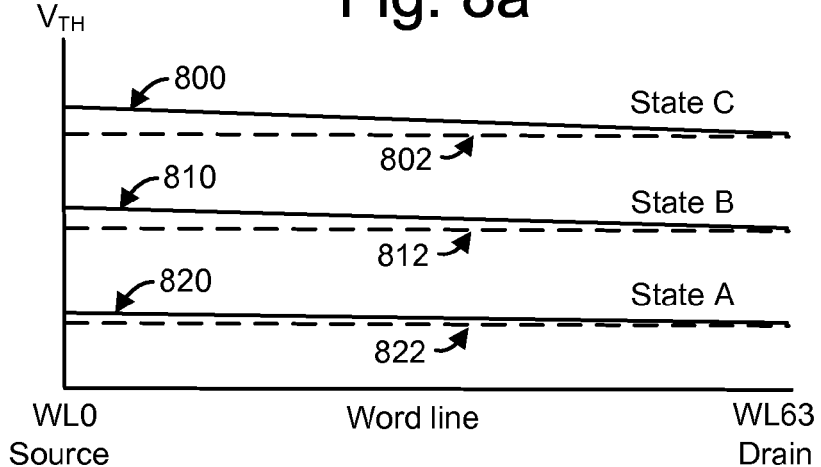
FIG. 8a depicts compensating for changes in the threshold voltage of a storage element versus word line position.

FIG. 8a depicts compensating for changes in the threshold voltage of a storage element versus word line position. As mentioned, storage elements of lower versus upper word lines which have been programmed to the same state will have different apparent threshold voltages. This due to the fact that the sensing of a selected storage element will be altered by the different resistance of the unselected storage elements during read versus verify. In particular, the threshold voltages of storage elements on lower word lines appear to be shifted higher during read operations than storage elements on higher word lines. For instance, lines 800, 810 and 820 depict a mean threshold voltage versus word line position relationship for storage elements which have been programmed to states C, B or A, respectively. Lines 800, 810 and 820 correspond to the threshold voltage distributions 602, 612 and 622, respectively, of FIG. 6. In this case, a common gate voltage is applied via a respective word line during verify and read for each state. Lines 802, 812 and 822 depict a desired threshold voltage versus word line position relationship in which the threshold voltage shift is compensated for states C, B and A, respectively. Lines 802, 812 and 822 correspond to the threshold voltage distributions 600, 610 and 620, respectively, of FIG. 6. Compensating for the threshold voltage shift can avoid a situation in which failures or errors (such as over-programming or data retention failures) are concentrated on a few word lines, e.g., the lower word lines, instead of being spread uniformly over all the word lines. Techniques are discussed below in which the front-pattern effect can be compensated (partially or completely), and in which the failures can be spread uniformly across the word lines.

Figures 8B, 9A:
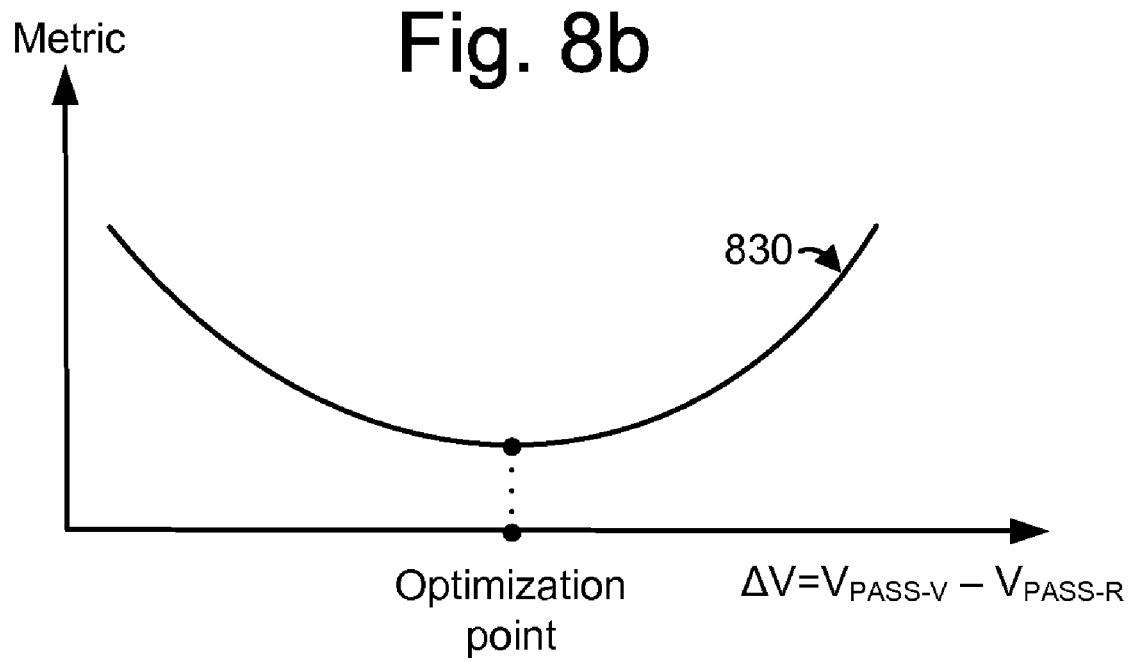
FIG. 8b depicts a graph showing determining an optimum voltage difference between read and verify voltages based on a metric.
FIG. 9a depicts a first option for verify and read voltages.

FIG. 8b depicts a graph showing determining an optimum voltage difference between read and verify voltages based on a metric. In one possible approach, a verify pass voltage $V_{PASS-V}$ is higher than a read pass voltage $V_{PASS-R}$, where the difference $\Delta V$ is optimized for a particular memory device design, or even on a device by device basis. For example, an optimization process may be performed, such as at the time of manufacture of a memory device, in which the optimum value of $\Delta V$ is determined based on a metric. In one approach, the metric, represented by curve 830, is a number of read errors, or some other metric regarding an error correction code (ECC) decoding process, such as the amount of time or number of iterations needed to converge when decoding data read from the memory device. In this case, it is desired to minimize the number of errors or the time or number of iterations to decode. Or, the metric can represent the width of the threshold distributions of a group of storage elements. In this case, it is desired to minimize the width of the threshold distributions, e.g., to have narrower distributions. See, e.g., FIG. 6. With the implementations provided herein, the narrower threshold voltage distributions 600, 610 and 620 can be achieved instead of the widened distributions 602, 612 and 622, respectively. Such narrower threshold voltage distributions can improve read accuracy and allow more data states within a given voltage threshold window.

A metric may similarly be based on a combination of these two metrics, and other metrics may be used as well. A process discussed further in connection with FIG. 10a may be used to determine an optimized verify and read pass voltages. Note that the example of FIG. 8b is a simplified example in which there is a clear minimum. In other cases, there may be more than one minimum, in which case judgment and other factors can be used to selected a desired $\Delta V$.

FIG. 9a depicts a first option for verify and read voltages. In this case, the same verify pass voltage $V_{PASS-V-HIGH}$ is used on the source and drain side word lines, while $V_{CG-V}$ is applied to the selected word line. $V_{PASS-V-HIGH}$ exceeds the read pass voltage $V_{PASS-R}$ by $\Delta V$, which is optimized for a particular memory device. $\Delta V=0.5$-$1.0$ V may be optimal in some cases. In an example embodiment, $V_{PASS-V-HIGH}=6.0$ V and $V_{PASS-R}=5.5$ V. Thus, during a program-verify operation on a selected word line, WLn, $V_{PASS-V-HIGH}$ is used on both the drain-side and source-side unselected word lines, and during the subsequent read operation on WLn, $V_{PASS-R}$ is used on both the drain-side and source-side unselected word lines. Advantages of this approach include simplicity in that the same verify pass voltage can be used for all unselected word lines.

By using a higher pass voltage on unselected word lines during program-verify than during read, the source-side resistance for the selected word line is made higher in read than in program-verify. This causes the threshold voltage of selected storage elements which are associated with the selected word line to be raised up (due to higher source-side resistance and body-effect from the source-side) during read. Moreover, the shift up in threshold voltage is more for higher word lines than for lower word lines. This word line dependence is opposite from the word line dependence due to the front-pattern effect. Thus, by using a higher pass voltage on unselected word lines during program-verify than during read, we can compensate for the front-pattern effect and make the word line dependence of threshold voltage (or failures) more uniform over the word lines.

Note that in this and other embodiments, it is possible for some of the unselected word lines to receive different voltages from those depicted as this will generally not impair the overall benefit of compensating for changes in resistance for unprogrammed versus programmed or partly programmed storage elements. For example, the above-mentioned embodiment may be modified so that a substantially number, e.g., a substantial majority of the source side and/or drain side unselected storage elements receive $V_{PASS-V-HIGH}$ during verify operations. For instance, this could be 80% or more of the source side and/or drain side unselected storage elements.

Furthermore, the proposed verify and read pass voltages may be applied regardless of the position of the selected word line in a block or other set of word lines. Or, the proposed verify and read pass voltages may be applied for word lines which span a large portion of the NAND string or other series-connected set of storage elements, e.g., such as between a first word line which is within x/4 storage elements of the source side select gate and a second word line which is within x/4 storage elements of the drain side select gate, where x is the number of word lines. As an example, with x=8, the proposed verify and read pass voltages may be applied for word lines which span WL1 to WL6 since WL1 is within two word lines of the source side select gate and WL6 is within two word lines of the drain side select gate.

FIG. 9b depicts a second option for verify and read voltages. In this case, the higher verify pass voltage $V_{PASS-V-HIGH}$ is used on the source side word lines, where $V_{PASS-V-HIGH}>V_{PASS-R}$, while the lower verify pass voltage $V_{PASS-V-LOW}$ is used on the drain side word lines, where $V_{PASS-V-LOW}=V_{PASS-R}$. This approach provides compensation for the storage elements of all the unselected word lines. Advantages of this approach may include reduced power consumption. The resistance of the erased storage elements on the drain side will not change significantly compared to the approach of FIG. 9a due to applying $V_{PASS-V-LOW}$ instead of $V_{PASS-V-HIGH}$.

FIG. 9c depicts a third option for verify and read voltages. This approach is similar to that of FIG. 9b except that a lower supply voltage $V_{DD}<V_{PASS-V-LOW}$ is applied to the drain side unselected word lines. $V_{DD}$ can be much lower than $V_{PASS-R}$, e.g., about 2-4 V lower. For example, $V_{DD}$ can be about 1.5-3.5 V when $V_{PASS-R}$ is about 5.5 V. Advantages of this approach may include reduced power consumption. However, voltage sensitivity may be reduced compared to other embodiments such as that of FIG. 9a.

FIG. 9d depicts a fourth option for verify and read voltages. This approach may include modifying any of the previous approaches so that one or both word lines which are adjacent to the selected word line receive the same voltage during both verify and read operations. WLn is the selected word line, WLn−1 is the adjacent source side selected word line, and WLn+1 is the adjacent drain side selected word line. The depicted implementation modifies the approach of FIG. 9a by providing a verify pass voltage $V_{PASS-V}$ on WLn−1 and/or WLn+1 which is the same as $V_{PASS-R}$, the read pass voltage. Maintaining the same or nearly the same voltage on one or more of the adjacent word lines can avoid or reduce variations in word line coupling between verify and read. That is, during verify or read, a pass voltage applied to WLn−1 or WLn+1 can be coupled to the selected word line, affecting the sensing of the associated selected storage element. If the pass voltage differs between verify and read, the sensing of the associated selected storage element is affected differently, which hurts the ability to perform an accurate read. The proposed solution addresses this problem. Note that the adjacent word lines WLn−1 and WLn+1 provide the most coupling to WLn. However, some coupling may be provided by other neighboring word lines, e.g., WLn−2 and WLn+2, in which case the implementation can be extended to such additional word lines by providing the same or nearly the same pass voltages on them during verify and read.

Another possible approach is to use a "look ahead" scheme in which the state of a storage element on WLn−1 and/or WLn+1 is determined before reading WLn, and a read pass voltage is applied to WLn−1 and/or WLn+1 at a level which is based on the determined state. This can compensate for the fact that the reading of a storage element on WLn can be affected by the state of an adjacent storage element on WLn−1 and/or WLn+1.

Note that it is not necessary to use a fixed read pass voltage on all unselected word lines during a read operation. In one option, different source and drain side voltages are used.

Moreover, the schemes provided are compatible with multi-pass programming, where the storage elements of some or all word lines are partially programmed to a first state in a first programming pass, and then programmed further to their final intended states in a second or other further program pass. See, e.g., FIGS. 18a-c. In such cases, different verify pass voltages can be used in the different passes, if desired. The specific verify pass voltages of FIGS. 9a-d, for instance, should be used in the final pass, which results in the storage elements completing programming to their final intended state. For instance, in a two-pass programming technique, the second pass is the final pass.

It is also possible to provide different verify and/or read pass voltages based on a position of the selected word line.

FIG. 10a depicts an optimization process for determining optimum verify and read voltages for a set of storage elements. Note that the steps shown are not necessarily performed as discrete steps or in the order shown. Generally, an optimization process may be performed, such as at the time of manufacture of a memory device, in which the optimum verify and read pass voltages are determined. In one approach, the optimized voltages are determined for a particular memory design and the same voltages are used for all devices of that design. In another approach, the optimized voltages are customized for each individual device. Once the optimized voltages are determined, corresponding information can be stored in the memory device, such as in a non-volatile storage location of the controller, so that it can be subsequently accessed during verify and read operations.

An optimization process can include repeatedly programming and reading a set of storage elements using different verify and read pass voltages, and obtaining a metric which characterizes each program and read. Once a number of metrics are obtained, one of them can be identified as being optimum, and the corresponding optimum verify and read pass voltages can be identified. The set of storage elements which is programmed may be associated with one or more word lines, and may include all or less than a block. Further, the programmed data can be random test data, in one possible approach.

An example optimization process begins at step 1000. A program operation begins at step 1002. Step 1004 includes selecting a set of verify pass voltages. For example, any of the sets of verify pass voltages depicted in FIGS. 9a-d may be used. Step 1006 includes beginning a cycle of a program operation. A program operation typically includes multiple cycles of program and verify operations, typically using a higher program pulse in each successive cycle. See also FIG. 20, which depicts program and verify voltages in multiple cycles of a program operation. Step 1008 includes applying a program pulse to a selected word line. Step 1010 includes performing a verify operation. This includes applying verify pass voltages to unselected word lines, applying the control gate verify voltage $V_{CG-V}$ to the selected word line, and sensing the selected storage elements. As mentioned, different values of $V_{CG-V}$ may be applied to a selected word line when different storage elements are being programmed to different states. Sensing occurs for the different storage elements at different times according to which $V_{CG-V}$ level is currently applied. The current cycle of the program operation ends at step 1012.

At decision step 1014, if all storage elements have been verified to have reached their intended states, and, at decision step 1016, there are no further word lines to program, the program operation ends at step 1018. If all storage elements are not yet verified, an additional programming cycle is performed at step 1006, typically with a stepped up program voltage. If a next word line is to be programmed at decision step 1016, the next word line is selected and another cycle of the program operation begins at step 1006, typically starting at an initial value of the program voltage.

Once the program operation has ended at step 1018, a read operation begins at step 1020. Step 1022 includes selecting a set of read pass voltages. For example, any of the sets of read pass voltages depicted in FIGS. 9a-d may be used, consistent with the verify pass voltages which were used during program-verify. Step 1024 includes performing a read operation, which includes applying read pass voltages to unselected word lines, applying the control gate read voltage $V_{CG-R}$ to the selected word line, and sensing the selected storage elements. As mentioned, different values of $V_{CG-R}$ may be applied to a selected word line when a multi-level storage element is being read. Sensing occurs at separate times for the different $V_{CG-R}$ levels. If there is a next word line to read at decision step 1026, a next read operation begins at step 1020. Otherwise, the read operation ends at step 1028. Step 1030 includes obtaining and storing a metric for the current set of verify and read pass voltages. For example, as mentioned, this can include tracking a number of read errors, or a decoding time or number of iterations of an ECC decoding engine.

At step 1032, if a next pass of the optimization process is desired, the storage elements are erased at step 1034, and a new programming operation begins at step 1002. A predetermined number of passes through the optimization process can be performed. Each pass yields a metric for each set of verify and read pass voltages. If no further pass of the optimization process is needed at step 1032, the stored metrics and sets of verify and read pass voltages are accessed at step 1036. This information can be stored, e.g., in the memory device, an associated host or in test equipment. Step 1038 includes determining which set of verify and read pass voltages optimizes the metric. See also FIG. 8b. Note that in some cases, a fixed read pass voltage is used, in which case only it is only necessary to track the verify pass voltage or voltages. Step 1040 includes storing the optimized set of verify and read pass voltages in the memory device for subsequent use, and the optimization process ends at step 1042.

As an example, if the verify and read pass voltages of FIG. 9a are used, different values of $V_{PASS-V-HIGH}$ can be used in the different program passes of the optimization process. For instance, one pass may use $V_{PASS-V-HIGH-1}$ and $V_{PASS-R}$, to obtain a metric M1, another pass may use $V_{PASS-V-HIGH-2}$ and $V_{PASS-R}$, to obtain a metric M2, another pass may use $V_{PASS-V-HIGH-3}$ and $V_{PASS-R}$, to obtain a metric M3, and so forth. The optimum metric among M1, M2 and M3 can then be selected. Assuming M2 is optimum, this means $V_{PASS-V-HIGH-2}$ and $V_{PASS-R}$ are the optimum verify and read pass voltages, respectively. A similar procedure can be used for the verify and read pass voltage schemes of FIGS. 9b-d, where $V_{PASS-V-HIGH}$ is varied among the different values represented by $V_{PASS-V-HIGH-1}$, $V_{PASS-V-HIGH-2}$, $V_{PASS-V-HIGH-3}$, and so forth. As a numerical example, with $V_{PASS-R}$=5.5 V, we may have $V_{PASS-V-HIGH-1}$=5.6 V, $V_{PASS-V-HIGH-2}$=5.7 V, $V_{PASS-V-HIGH-3}$=5.8 V and so forth.

Figure 10B:
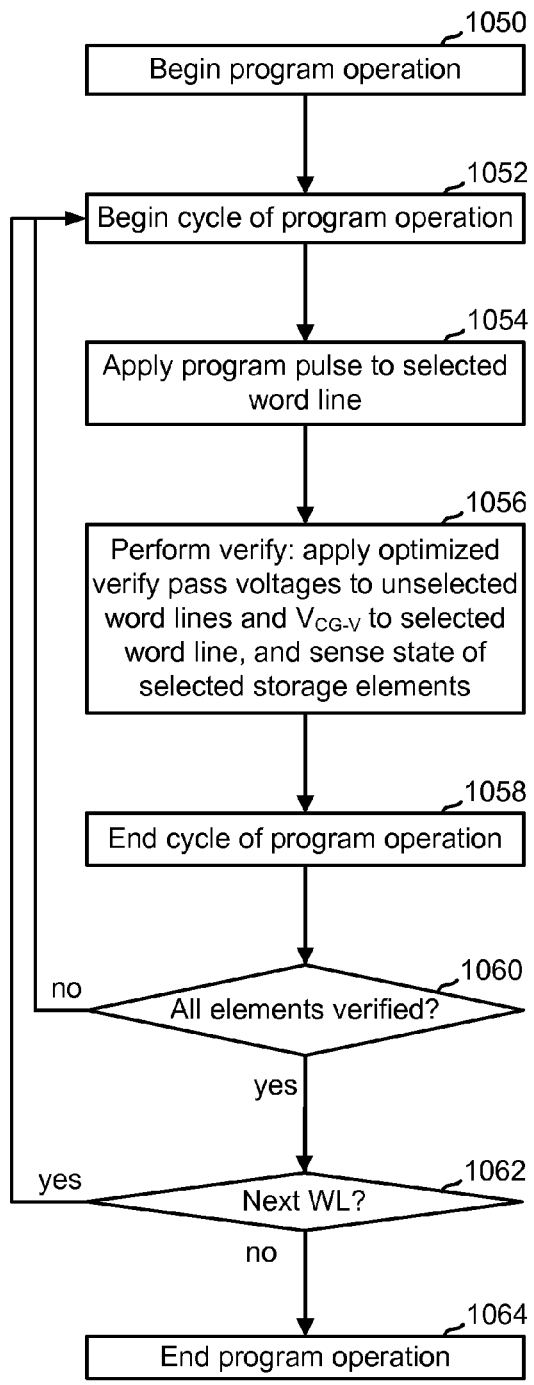
FIG. 10b depicts a programming process which uses optimum verify and read pass voltages.

FIG. 10b depicts a programming process which uses optimum verify and read pass voltages. Once a memory device has been configured with optimum verify and read pass voltages, a program operation can be performed to store user data, such as while the device is in the possession of the end user. Step 1052 includes beginning a cycle of a program operation. Step 1054 includes applying a program pulse to a selected word line. Step 1056 includes performing a verify operation. This includes applying the optimized verify pass voltages to unselected word lines, applying the control gate verify voltage $V_{CG-V}$ to the selected word line, and sensing the selected storage elements. The current cycle of the program operation ends at step 1058.

At decision step 1060, if all storage elements have been verified to have reached their intended states, and, at decision step 1062, there are no further word lines to program, the program operation ends at step 1064. If all storage elements are not yet verified, an additional programming cycle is performed at step 1052, typically with a stepped up program voltage. If a next word line is to be programmed at decision step 1062, the next word line is selected and another cycle of the program operation begins at step 1052, typically starting at an initial value of the program voltage. The program operation ends at step 1064.

Figure 10C:
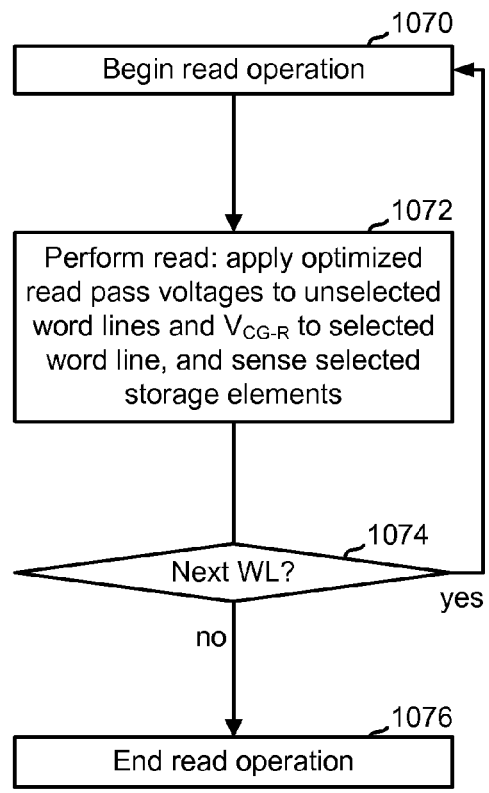
FIG. 10c depicts a read process which uses optimum verify and read pass voltages.

FIG. 10c depicts a read process which uses optimum verify and read pass voltages. The read process may be performed after the program process of FIG. 10b, for instance. A read operation begins at step 1070. Step 1072 includes performing a read operation, which includes applying read pass voltages to unselected word lines, applying the control gate read voltage $V_{CG-R}$ to the selected word line, and sensing the selected storage elements. If there is a next word line to read at decision step 1074, a next read operation begins at step 1070. Otherwise, the read operation ends at step 1076.

Figure 11:
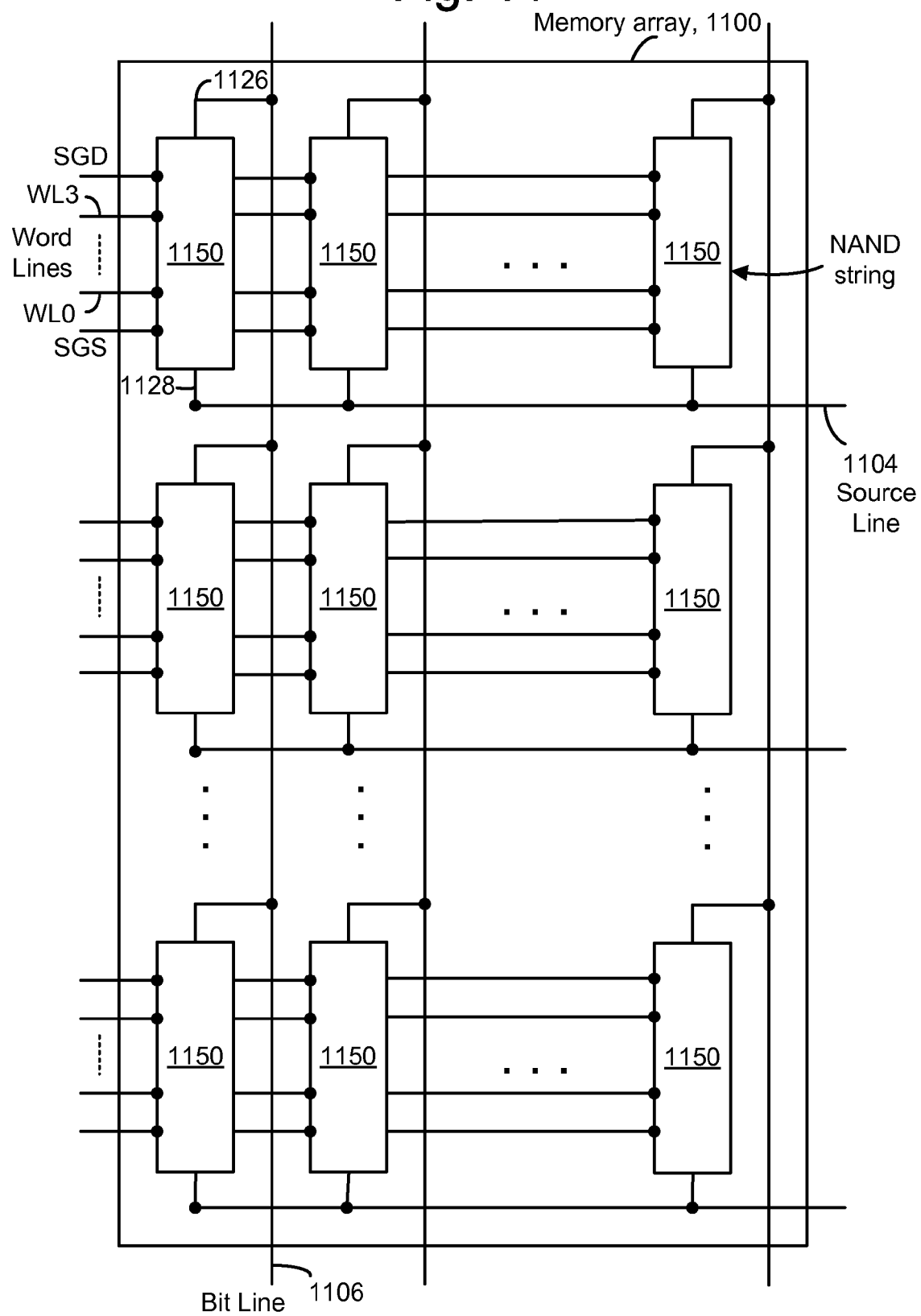
FIG. 11 is a block diagram of an array of NAND flash storage elements.

FIG. 11 illustrates an example of an array 1100 of NAND storage elements, such as those shown in FIGS. 1 and 2. Along each column, a bit line 1106 is coupled to the drain terminal 1126 of the drain select gate for the NAND string 1150. Along each row of NAND strings, a source line 1104 may connect all the source terminals 1128 of the source select gates of the NAND strings. An example of a NAND architecture array and its operation as part of a memory system is found in U.S. Pat. Nos. 5,570,315; 5,774,397; and 6,046,935.

The array of storage elements is divided into a large number of blocks of storage elements. As is common for flash EEPROM systems, the block is the unit of erase. That is, each block contains the minimum number of storage elements that are erased together. Each block is typically divided into a number of pages. A page is a unit of programming. In one embodiment, the individual pages may be divided into segments and the segments may contain the fewest number of storage elements that are written at one time as a basic programming operation. One or more pages of data are typically stored in one row of storage elements. A page can store one or more sectors. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain.

A sector of user data is typically 512 bytes, corresponding to the size of a sector in magnetic disk drives. Overhead data is typically an additional 16-20 bytes. A large number of pages form a block, anywhere from 8 pages, for example, up to 32, 64, 128 or more pages. In some embodiments, a row of NAND strings comprises a block.

Memory storage elements are erased in one embodiment by raising the p-well to an erase voltage (e.g., 14-22 V) for a sufficient period of time and grounding the word lines of a selected block while the source and bit lines are floating. Due to capacitive coupling, the unselected word lines, bit lines, select lines, and c-source are also raised to a significant fraction of the erase voltage. A strong electric field is thus applied to the tunnel oxide layers of selected storage elements and the data of the selected storage elements are erased as electrons of the floating gates are emitted to the substrate side, typically by Fowler-Nordheim tunneling mechanism. As electrons are transferred from the floating gate to the p-well region, the threshold voltage of a selected storage element is lowered. Erasing can be performed on the entire memory array, separate blocks, or another unit of storage elements.

Figure 12:
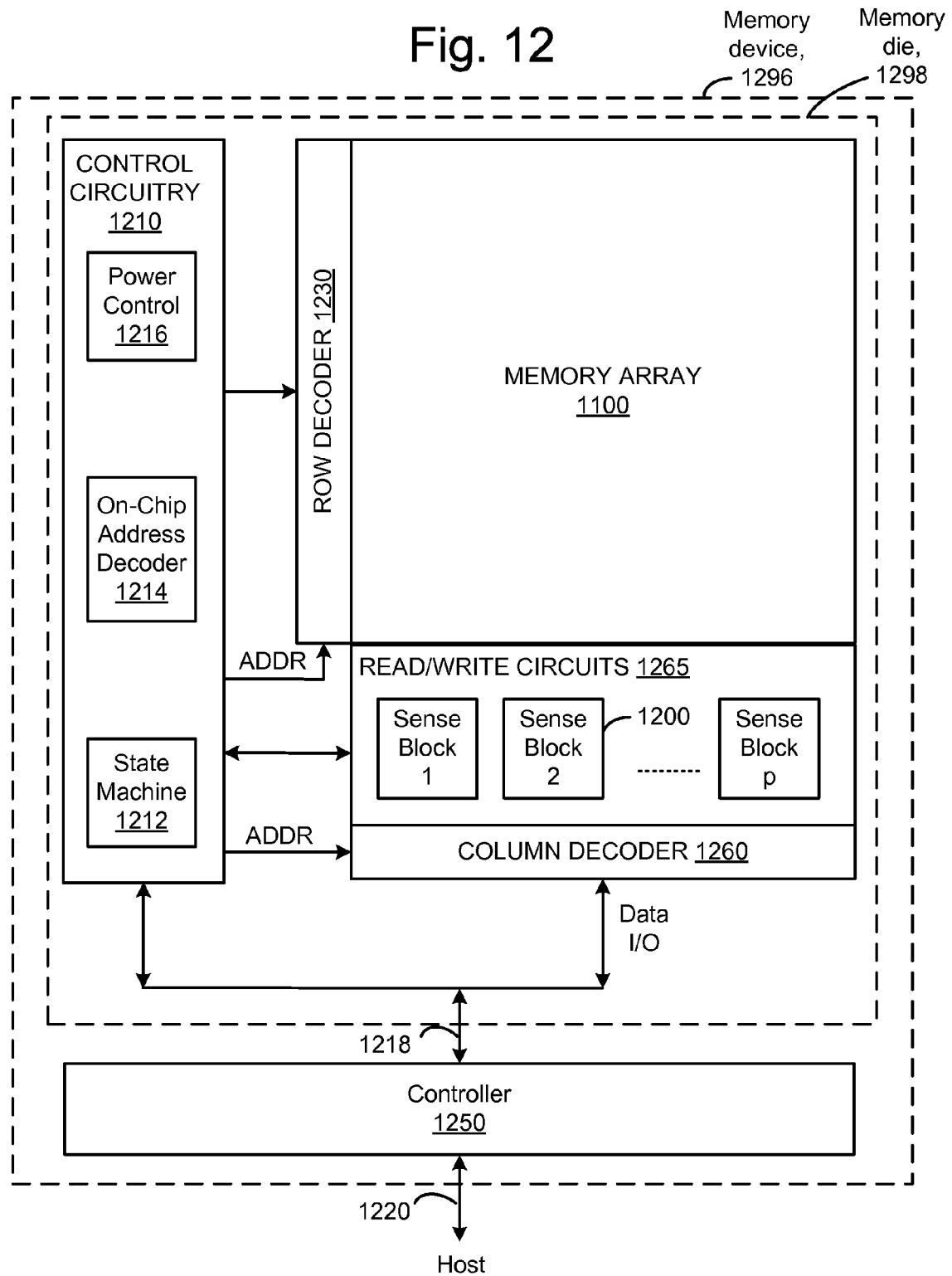
FIG. 12 is a block diagram of a non-volatile memory system using single row/column decoders and read/write circuits.

FIG. 12 is a block diagram of a non-volatile memory system using single row/column decoders and read/write circuits. The diagram illustrates a memory device 1296 having read/write circuits for reading and programming a page of storage elements in parallel, according to one embodiment of the present invention. Memory device 1296 may include one or more memory die 1298. Memory die 1298 includes a two-dimensional array of storage elements 1100, control circuitry 1210, and read/write circuits 1265. In some embodiments, the array of storage elements can be three dimensional. The memory array 1100 is addressable by word lines via a row decoder 1230 and by bit lines via a column decoder 1260. The read/write circuits 1265 include multiple sense blocks 1200 and allow a page of storage elements to be read or programmed in parallel. Typically a controller 1250 is included in the same memory device 1296 (e.g., a removable storage card) as the one or more memory die 1298. Commands and Data are transferred between the host and controller 1250 via lines 1220 and between the controller and the one or more memory die 1298 via lines 1218.

The control circuitry 1210 cooperates with the read/write circuits 1265 to perform memory operations on the memory array 1100. The control circuitry 1210 includes a state machine 1212, an on-chip address decoder 1214 and a power control module 1216. The state machine 1212 provides chip-level control of memory operations, and may include an ECC decoding engine. The on-chip address decoder 1214 provides an address interface between that used by the host or a memory controller to the hardware address used by the decoders 1230 and 1260. The power control module 1216 controls the power and voltages supplied to the word lines and bit lines during memory operations.

In some implementations, some of the components of FIG. 12 can be combined. In various designs, one or more of the components (alone or in combination), other than storage element array 1100, can be thought of as a managing circuit. For example, one or more managing circuits may include any one of or a combination of control circuitry 1210, state machine 1212, decoders 1214/1260, power control 1216, sense blocks 1200, read/write circuits 1265, controller 1250, and so forth.

Figure 13:
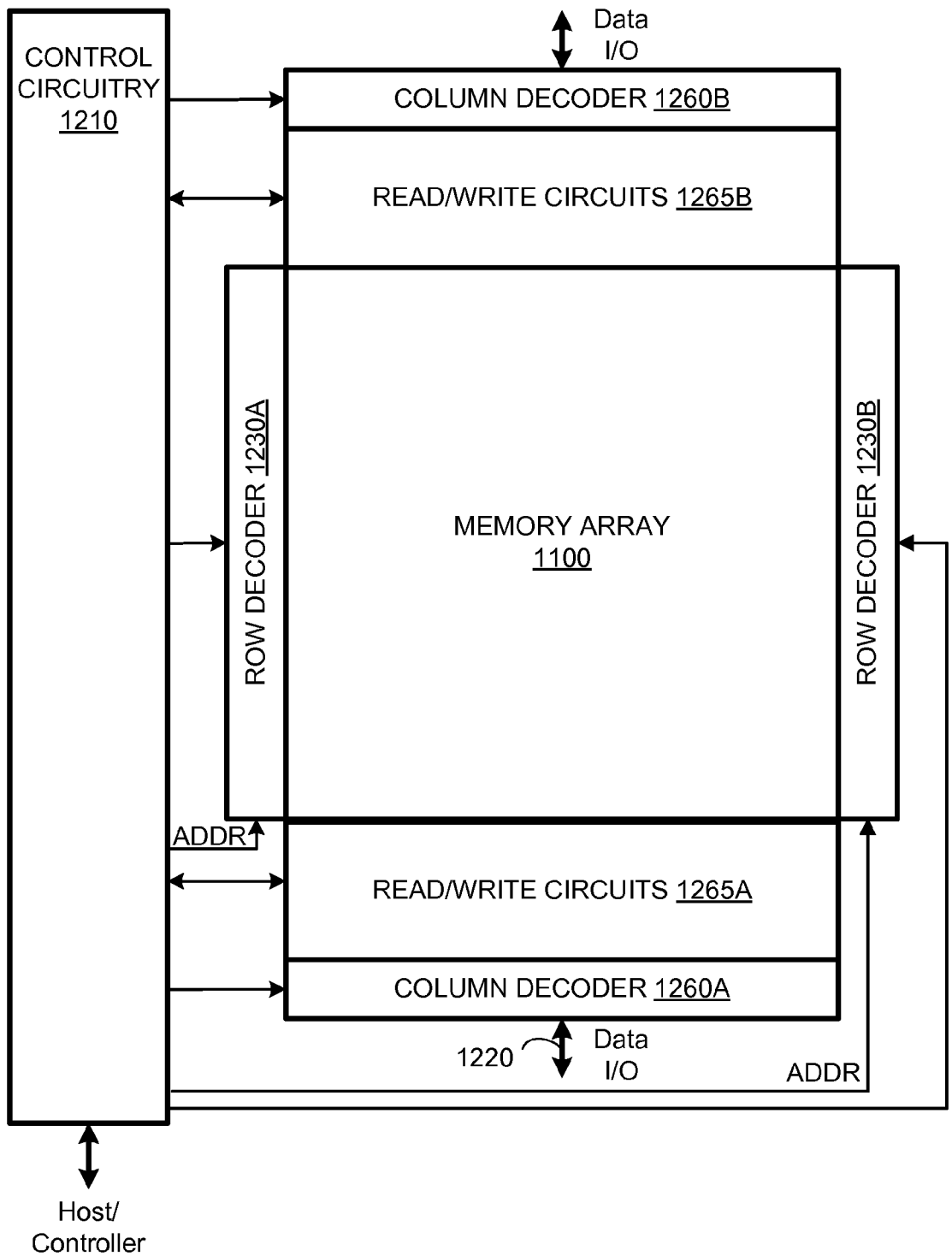
FIG. 13 is a block diagram of a non-volatile memory system using dual row/column decoders and read/write circuits.

FIG. 13 is a block diagram of a non-volatile memory system using dual row/column decoders and read/write circuits. Here, another arrangement of the memory device 1296 shown in FIG. 12 is provided. Access to the memory array 1100 by the various peripheral circuits is implemented in a symmetric fashion, on opposite sides of the array, so that the densities of access lines and circuitry on each side are reduced by half. Thus, the row decoder is split into row decoders 1230A and 1230B and the column decoder into column decoders 1260A and 1260B. Similarly, the read/write circuits are split into read/write circuits 1265A connecting to bit lines from the bottom and read/write circuits 1265B connecting to bit lines from the top of the array 1100. In this way, the density of the read/write modules is essentially reduced by one half. The device of FIG. 13 can also include a controller, as described above for the device of FIG. 12.

Figure 14:
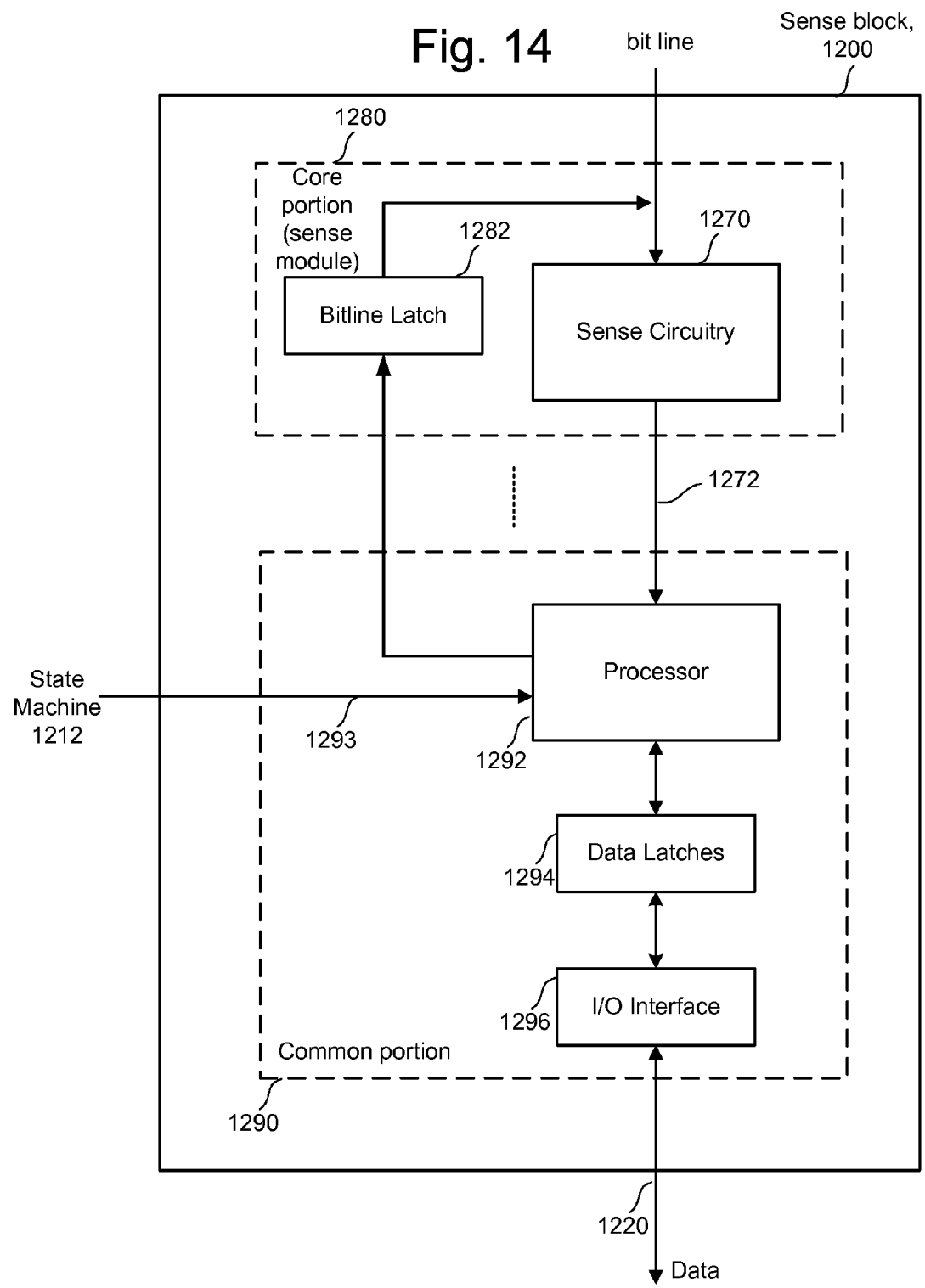
FIG. 14 is a block diagram depicting one embodiment of a sense block.

FIG. 14 is a block diagram depicting one embodiment of a sense block. An individual sense block 1200 is partitioned into a core portion, referred to as a sense module 1280, and a common portion 1290. In one embodiment, there will be a separate sense module 1280 for each bit line and one common portion 1290 for a set of multiple sense modules 1280. In one example, a sense block will include one common portion 1290 and eight sense modules 1280. Each of the sense modules in a group will communicate with the associated common portion via a data bus 1272. For further details refer to U.S. Patent Application Pub No. 2006/0140007, titled "Non-Volatile Memory and Method with Shared Processing for an Aggregate of Sense Amplifiers" published Jun. 29, 2006, and incorporated herein by reference in its entirety.

Sense module 1280 comprises sense circuitry 1270 that determines whether a conduction current in a connected bit line is above or below a predetermined threshold level. Sense module 1280 also includes a bit line latch 1282 that is used to set a voltage condition on the connected bit line. For example, a predetermined state latched in bit line latch 1282 will result in the connected bit line being pulled to a state designating program inhibit (e.g., 1.5-3 V).

Common portion 1290 comprises a processor 1292, a set of data latches 1294 and an I/O Interface 1296 coupled between the set of data latches 1294 and data bus 1220. Processor 1292 performs computations. For example, one of its functions is to determine the data stored in the sensed storage element and store the determined data in the set of data latches. The set of data latches 1294 is used to store data bits determined by processor 1292 during a read operation. It is also used to store data bits imported from the data bus 1220 during a program operation. The imported data bits represent write data meant to be programmed into the memory. I/O interface 1296 provides an interface between data latches 1294 and the data bus 1220.

During read or sensing, the operation of the system is under the control of state machine 1212 that controls the supply of different control gate voltages to the addressed storage element. As it steps through the various predefined control gate voltages corresponding to the various memory states supported by the memory, the sense module 1280 may trip at one of these voltages and an output will be provided from sense module 1280 to processor 1292 via bus 1272. At that point, processor 1292 determines the resultant memory state by consideration of the tripping event(s) of the sense module and the information about the applied control gate voltage from the state machine via input lines 1293. It then computes a binary encoding for the memory state and stores the resultant data bits into data latches 1294. In another embodiment of the core portion, bit line latch 1282 serves double duty, both as a latch for latching the output of the sense module 1280 and also as a bit line latch as described above.

It is anticipated that some implementations will include multiple processors 1292. In one embodiment, each processor 1292 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 1292 to accumulate the results of the associated bit lines such that the state machine need only read the wired-OR line one time. Similarly, by choosing the logic levels correctly, the global state machine can detect when the first bit changes its state and change the algorithms accordingly.

During program or verify, the data to be programmed is stored in the set of data latches 1294 from the data bus 1220. The program operation, under the control of the state machine, comprises a series of programming voltage pulses applied to the control gates of the addressed storage elements. Each programming pulse is followed by a read back (verify) to determine if the storage element has been programmed to the desired memory state. Processor 1292 monitors the read back memory state relative to the desired memory state. When the two are in agreement, the processor 1292 sets the bit line latch 1282 so as to cause the bit line to be pulled to a state designating program inhibit. This inhibits the storage element coupled to the bit line from further programming even if programming pulses appear on its control gate. In other embodiments the processor initially loads the bit line latch 1282 and the sense circuitry sets it to an inhibit value during the verify process.

Data latch stack 1294 contains a stack of data latches corresponding to the sense module. In one embodiment, there are three data latches per sense module 1280. In some implementations (but not required), the data latches are implemented as a shift register so that the parallel data stored therein is converted to serial data for data bus 1220, and vice versa. In the preferred embodiment, all the data latches corresponding to the read/write block of m storage elements can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the structure and/or operations of various embodiments of non-volatile storage devices can be found in (1) U.S. Pat. No. 7,196,931, titled, "Non-Volatile Memory And Method With Reduced Source Line Bias Errors," issued Mar. 27, 2007; (2) U.S. Pat. No. 7,023,736, title "Non-Volatile Memory And Method with Improved Sensing," issued Apr. 4, 2006; (3) U.S. Pat. No. 7,046,568, titled "Improved Memory Sensing Circuit And Method For Low Voltage Operation," issued May 16, 2006; (4) U.S. Pat. No. 7,196,928, titled "Compensating for Coupling During Read Operations of Non-Volatile Memory," issued Mar. 27, 2007; and (5) U.S. Pat. No. 7,327,619, titled "Reference Sense Amplifier For Non-Volatile Memory", issued Feb. 5, 2008. All five of the immediately above-listed patent documents are incorporated herein by reference in their entirety.

Figure 15:
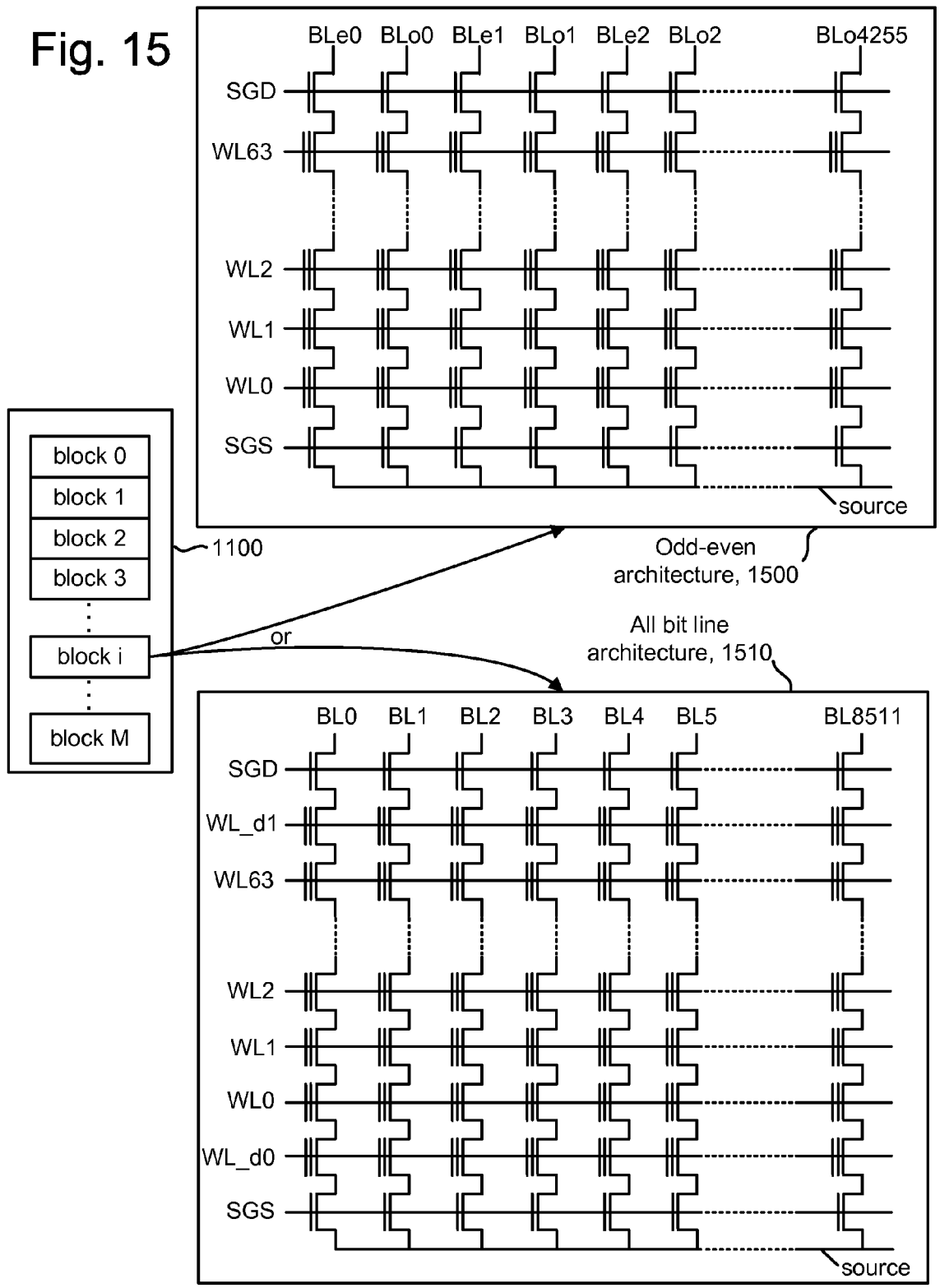
FIG. 15 illustrates an example of an organization of a memory array into blocks for an all bit line memory architecture or for an odd-even memory architecture.

FIG. 15 illustrates an example of an organization of a memory array into blocks for an all bit line memory architecture or for an odd-even memory architecture. Exemplary structures of memory array 1100 are described. As one example, a NAND flash EEPROM is described that is partitioned into 1,024 blocks. The data stored in each block can be simultaneously erased. In one embodiment, the block is the minimum unit of storage elements that are simultaneously erased. In each block, in this example, there are 8,512 columns corresponding to bit lines BL0, BL1, . . . BL8511. In one embodiment referred to as an all bit line (ABL) architecture (architecture 1510), all the bit lines of a block can be simultaneously selected during read and program operations. Storage elements along a common word line and connected to any bit line can be programmed at the same time.

In the example provided, four storage elements are connected in series to form a NAND string. Although four storage elements are shown to be included in each NAND string, more or less than four can be used (e.g., 16, 32, 64 or another number). One terminal of the NAND string is connected to a corresponding bit line via a drain select gate (connected to select gate drain lines SGD), and another terminal is connected to c-source via a source select gate (connected to select gate source line SGS).

In another embodiment, referred to as an odd-even architecture (architecture 1500), the bit lines are divided into even bit lines (BLe) and odd bit lines (BLo). In the odd/even bit line architecture, storage elements along a common word line and connected to the odd bit lines are programmed at one time, while storage elements along a common word line and connected to even bit lines are programmed at another time. In each block, in this example, there are 8,512 columns that are divided into even columns and odd columns. In this example, four storage elements are shown connected in series to form a NAND string. Although four storage elements are shown to be included in each NAND string, more or fewer than four storage elements can be used.

During one configuration of read and programming operations, 4,256 storage elements are simultaneously selected. The storage elements selected have the same word line and the same kind of bit line (e.g., even or odd). Therefore, 532 bytes of data, which form a logical page, can be read or programmed simultaneously, and one block of the memory can store at least eight logical pages (four word lines, each with odd and even pages). For multi-state storage elements, when each storage element stores two bits of data, where each of these two bits are stored in a different page, one block stores sixteen logical pages. Other sized blocks and pages can also be used.

For either the ABL or the odd-even architecture, storage elements can be erased by raising the p-well to an erase voltage (e.g., 20 V) and grounding the word lines of a selected block. The source and bit lines are floating. Erasing can be performed on the entire memory array, separate blocks, or another unit of the storage elements which is a portion of the memory device. Electrons are transferred from the floating gates of the storage elements to the p-well region so that the $V_{TH}$ of the storage elements becomes negative.

In the read and verify operations, the select gates (SGD and SGS) are connected to a voltage in a range of 2.5-4.5 V and the unselected word lines (e.g., WL0, WL1 and WL3, when WL2 is the selected word line) are raised to a read pass voltage, $V_{READ}$, (typically a voltage in the range of 4.5 to 6 V) to make the transistors operate as pass gates. The selected word line WL2 is connected to a voltage, a level of which is specified for each read and verify operation in order to determine whether a $V_{TH}$ of the concerned storage element is above or below such level. For example, in a read operation for a two-level storage element, the selected word line WL2 may be grounded, so that it is detected whether the $V_{TH}$ is higher than 0 V. In a verify operation for a two level storage element, the selected word line WL2 is connected to 0.8 V, for example, so that it is verified whether or not the $V_{TH}$ has reached at least 0.8 V. The source and p-well are at 0 V. The selected bit lines, assumed to be the even bit lines (BLe), are pre-charged to a level of, for example, 0.7 V. If the $V_{TH}$ is higher than the read or verify level on the word line, the potential level of the bit line (BLe) associated with the storage element of interest maintains the high level because of the non-conductive storage element. On the other hand, if the $V_{TH}$ is lower than the read or verify level, the potential level of the concerned bit line (BLe) decreases to a low level, for example, less than 0.5 V, because the conductive storage element discharges the bit line. The state of the storage element can thereby be detected by a voltage comparator sense amplifier that is connected to the bit line.

The erase, read and verify operations described above are performed according to techniques known in the art. Thus, many of the details explained can be varied by one skilled in the art. Other erase, read and verify techniques known in the art can also be used.

FIG. 16 depicts an example set of threshold voltage distributions and one-pass programming. Example $V_{TH}$ distributions for the storage element array are provided for a case where each storage element stores two bits of data. A first threshold voltage distribution E is provided for erased storage elements. Three threshold voltage distributions, A, B and C for programmed storage elements, are also depicted. In one embodiment, the threshold voltages in the E distribution are negative and the threshold voltages in the A, B and C distributions are positive.

Each distinct threshold voltage range corresponds to predetermined values for the set of data bits. The specific relationship between the data programmed into the storage element and the threshold voltage levels of the storage element depends upon the data encoding scheme adopted for the storage elements. For example, U.S. Pat. Nos. 6,222,762 and 7,237,074, issued Jun. 26, 2007, both of which are incorporated herein by reference in their entirety, describe various data encoding schemes for multi-state flash storage elements. In one embodiment, data values are assigned to the threshold voltage ranges using a Gray code assignment so that if the threshold voltage of a floating gate erroneously shifts to its neighboring physical state, only one bit will be affected. One example assigns "11" to threshold voltage range E (state E), "10" to threshold voltage range A (state A), "00" to threshold voltage range B (state B) and "01" to threshold voltage range C (state C). However, in other embodiments, Gray code is not used. Although four states are shown, the present invention can also be used with other multi-state structures including those that include more or less than four states.

Three read reference voltages, Vra, Vrb and Vrc, are also provided for reading data from storage elements. By testing whether the threshold voltage of a given storage element is above or below Vra, Vrb and Vrc, the system can determine the state, e.g., programming condition, the storage element is in.

Further, three verify reference voltages, Vva, Vvb and Vvc, are provided. When programming storage elements to state A, the system will test whether those storage elements have a threshold voltage greater than or equal to Vva. When programming storage elements to state B, the system will test whether the storage elements have threshold voltages greater than or equal to Vvb. When programming storage elements to state C, the system will determine whether storage elements have their threshold voltage greater than or equal to Vvc.

In one embodiment, known as full sequence programming, storage elements can be programmed from the erase state E directly to any of the programmed states A, B or C. For example, a population of storage elements to be programmed may first be erased so that all storage elements in the population are in erased state E. A series of programming pulses such as depicted by the control gate voltage sequence of FIG. 20 will then be used to program storage elements directly into states A, B or C. While some storage elements are being programmed from state E to state A, other storage elements are being programmed from state E to state B and/or from state E to state C. When programming from state E to state C on WLn, the amount of parasitic coupling to the adjacent floating gate under WLn-1 reaches a maximum since the change in amount of charge on the floating gate under WLn is the largest as compared to the change in charge when programming from state E to state A or state E to state B. When programming from state E to state B the amount of coupling to the adjacent floating gate is less. When programming from state E to state A the amount of coupling is reduced even further.

Figure 17:
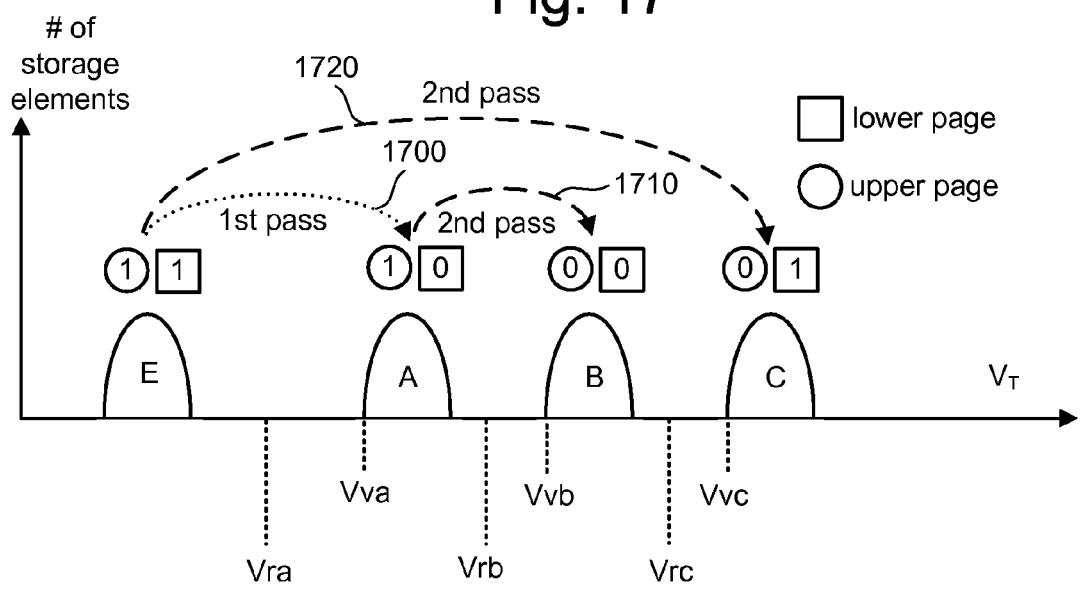
FIG. 17 depicts an example set of threshold voltage distributions and two-pass programming.

FIG. 17 illustrates an example of a two-pass technique of programming a multi-state storage element that stores data for two different pages: a lower page and an upper page. Four states are depicted: state E (11), state A (10), state B (00) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned.

In a first programming pass, the storage element's threshold voltage level is set according to the bit to be programmed into the lower logical page. If that bit is a logic "1," the threshold voltage is not changed since it is in the appropriate state as a result of having been earlier erased. However, if the bit to be programmed is a logic "0," the threshold level of the storage element is increased to be state A, as shown by arrow 1700. That concludes the first programming pass.

In a second programming pass, the storage element's threshold voltage level is set according to the bit being programmed into the upper logical page. If the upper logical page bit is to store a logic "1," then no programming occurs since the storage element is in one of the states E or A, depending upon the programming of the lower page bit, both of which carry an upper page bit of "1." If the upper page bit is to be a logic "0," then the threshold voltage is shifted. If the first pass resulted in the storage element remaining in the erased state E, then in the second phase the storage element is programmed so that the threshold voltage is increased to be within state C, as depicted by arrow 1720. If the storage element had been programmed into state A as a result of the first programming pass, then the storage element is further programmed in the second pass so that the threshold voltage is increased to be within state B, as depicted by arrow 1710. The result of the second pass is to program the storage element into the state designated to store a logic "0" for the upper page without changing the data for the lower page. In both FIG. 16 and FIG. 17, the amount of coupling to the floating gate on the adjacent word line depends on the final state.

In one embodiment, a system can be set up to perform full sequence writing if enough data is written to fill up an entire page. If not enough data is written for a full page, then the programming process can program the lower page programming with the data received. When subsequent data is received, the system will then program the upper page. In yet another embodiment, the system can start writing in the mode that programs the lower page and convert to full sequence programming mode if enough data is subsequently received to fill up an entire (or most of a) word line's storage elements. More details of such an embodiment are disclosed in U.S. Pat. No. 7,120,051, titled "Pipelined Programming of Non-Volatile Memories Using Early Data," issued Oct. 10, 2006, incorporated herein by reference in its entirety.

Figure 18A:
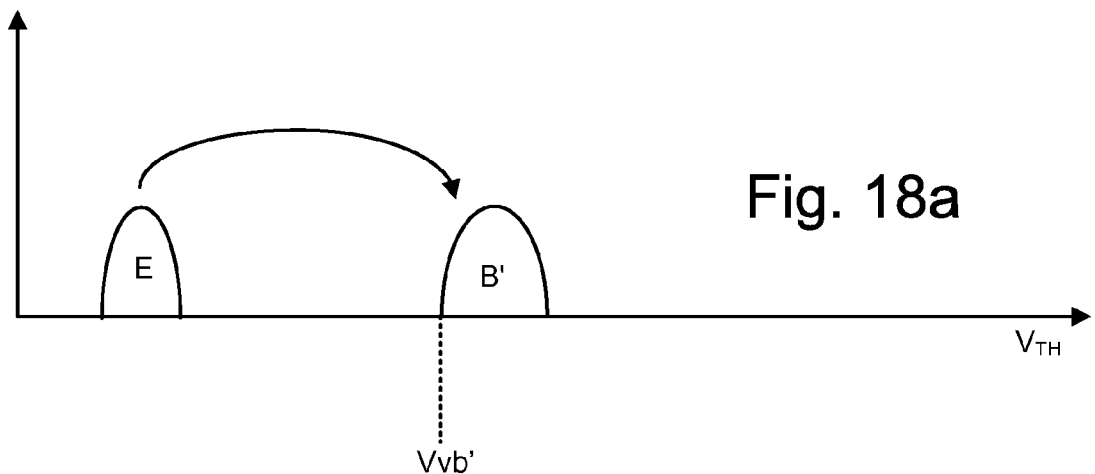
FIGS. 18a-c show various threshold voltage distributions and describe a process for programming non-volatile memory.
Figure 18B:
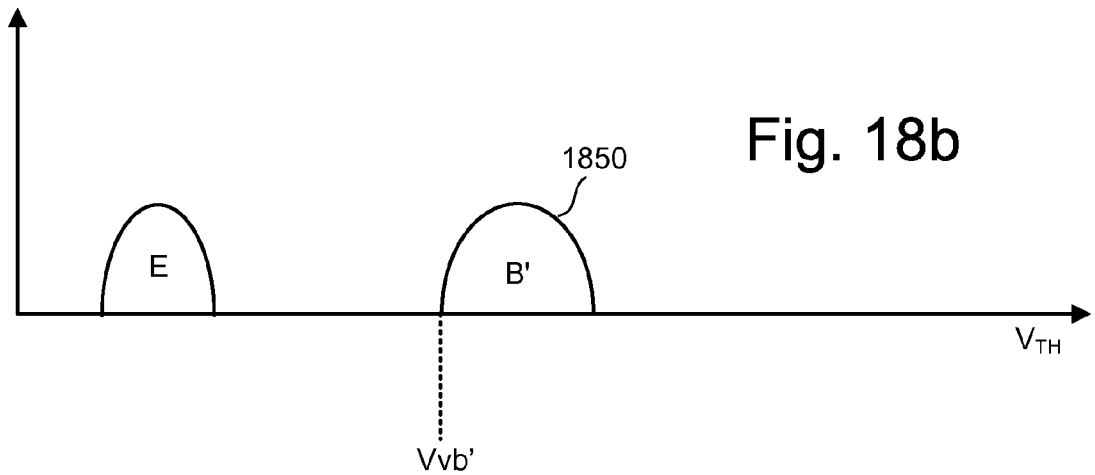
Figure 18C:
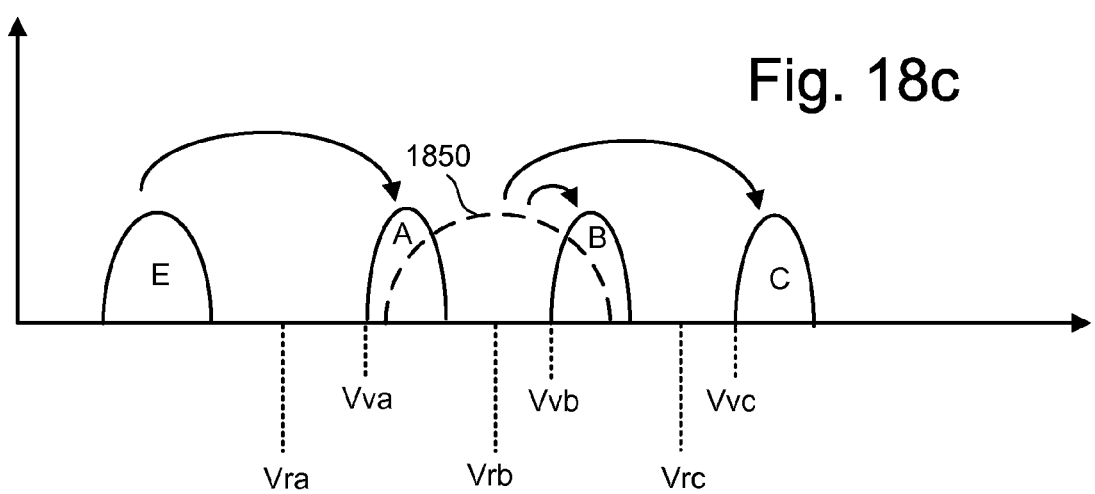

FIGS. 18*a-c* disclose another process for programming non-volatile memory that reduces the effect of floating gate to floating gate coupling by, for any particular storage element, writing to that particular storage element with respect to a particular page subsequent to writing to adjacent storage elements for previous pages. In one example implementation, the non-volatile storage elements store two bits of data per storage element, using four data states. For example, assume that state E is the erased state and states A, B and C are the programmed states. State E stores data 11. State A stores data 01. State B stores data 10. State C stores data 00. This is an example of non-Gray coding because both bits change between adjacent states A and B. Other encodings of data to physical data states can also be used. Each storage element stores two pages of data. For reference purposes, these pages of data will be called upper page and lower page; however, they can be given other labels. With reference to state A, the upper page stores bit 0 and the lower page stores bit 1. With reference to state B, the upper page stores bit 1 and the lower page stores bit 0. With reference to state C, both pages store bit data 0.

The programming process is a two-step process. In the first step, the lower page is programmed. If the lower page is to remain data 1, then the storage element state remains at state E. If the data is to be programmed to 0, then the threshold of voltage of the storage element is raised such that the storage element is programmed to state B'. FIG. 18*a* therefore shows the programming of storage elements from state E to state B'. State B' is an interim state B; therefore, the verify point is depicted as Vvb', which is lower than Vvb.

In one embodiment, after a storage element is programmed from state E to state B', its neighbor storage element (WLn+1) in the NAND string will then be programmed with respect to its lower page. For example, looking back at FIG. 2, after the lower page for storage element 106 is programmed, the lower page for storage element 104 would be programmed. After programming storage element 104, the floating gate to floating gate coupling effect will raise the apparent threshold voltage of storage element 106 if storage element 104 had a threshold voltage raised from state E to state B'. This will have the effect of widening the threshold voltage distribution for state B' to that depicted as threshold voltage distribution 1850 of FIG. 18*b*. This apparent widening of the threshold voltage distribution will be remedied when programming the upper page.

FIG. 18*c* depicts the process of programming the upper page. If the storage element is in erased state E and the upper page is to remain at 1, then the storage element will remain in state E. If the storage element is in state E and its upper page data is to be programmed to 0, then the threshold voltage of the storage element will be raised so that the storage element is in state A. If the storage element was in intermediate threshold voltage distribution 1850 and the upper page data is to remain at 1, then the storage element will be programmed to final state B. If the storage element is in intermediate threshold voltage distribution 1850 and the upper page data is to become data 0, then the threshold voltage of the storage element will be raised so that the storage element is in state C. The process depicted by FIGS. 18*a-c* reduces the effect of floating gate to floating gate coupling because only the upper page programming of neighbor storage elements will have an effect on the apparent threshold voltage of a given storage element. An example of an alternate state coding is to move from distribution 1850 to state C when the upper page data is a 1, and to move to state B when the upper page data is a 0.

Although FIGS. 18*a-c* provide an example with respect to four data states and two pages of data, the concepts taught can be applied to other implementations with more or fewer than four states and more or less than two pages.

Figure 19:
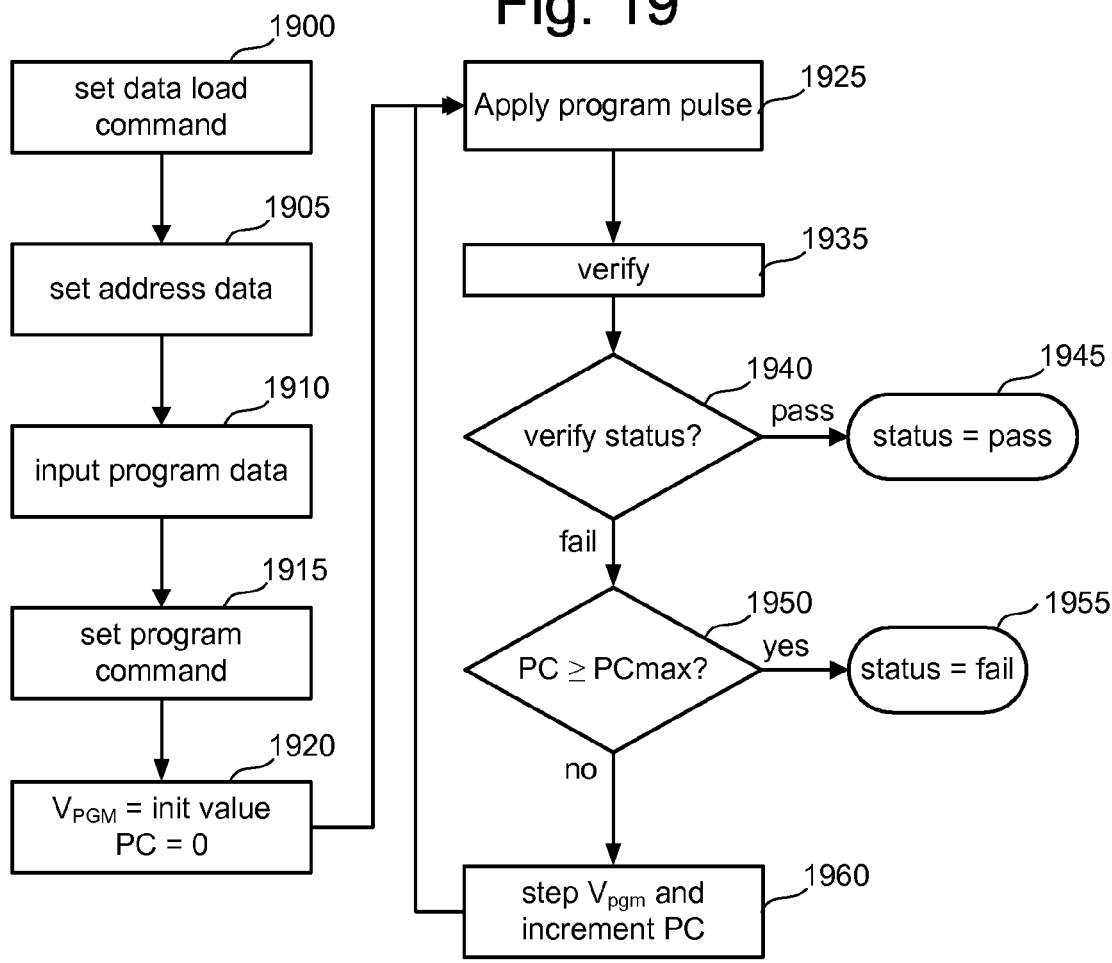
FIG. 19 is a flow chart describing one embodiment of a process for programming non-volatile memory.

FIG. 19 is a flow chart describing one embodiment of a method for programming non-volatile memory. In one implementation, storage elements are erased (in blocks or other units) prior to programming. In step 1900, a "data load" command is issued by the controller and input received by control circuitry 1210. In step 1905, address data designating the page address is input to decoder 1214 from the controller or host. In step 1910, a page of program data for the addressed page is input to a data buffer for programming. That data is latched in the appropriate set of latches. In step 1915, a "program" command is issued by the controller to state machine 1212.

Figure 20:
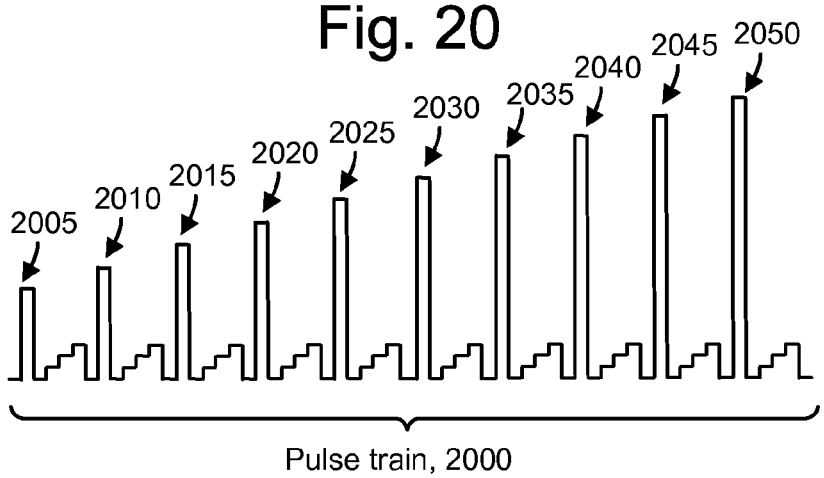
FIG. 20 depicts an example pulse train applied to the control gates of non-volatile storage elements during programming.

Triggered by the "program" command, the data latched in step 1910 will be programmed into the selected storage elements controlled by state machine 1212 using the stepped program pulses of the pulse train 2000 of FIG. 20 applied to the appropriate selected word line. In step 1920, the program voltage, $V_{PGM}$, is initialized to the starting pulse (e.g., 12 V or other value) and a program counter (PC) maintained by state machine 1212 is initialized at zero. At step 1925, the first $V_{PGM}$ pulse is applied to the selected word line to begin programming storage elements associated with the selected word line. If logic "0" is stored in a particular data latch indicating that the corresponding storage element should be programmed, then the corresponding bit line is grounded. On the other hand, if logic "1" is stored in the particular latch indicating that the corresponding storage element should remain in its current data state, then the corresponding bit line is connected to 1.5-3 V to inhibit programming.

In step 1935, the states of the selected storage elements are verified. If it is detected that the target threshold voltage of a selected storage element has reached the appropriate level, then the data stored in the corresponding data latch is changed to a logic "1." If it is detected that the threshold voltage has not reached the appropriate level, the data stored in the corresponding data latch is not changed. In this manner, a bit line having a logic "1" stored in its corresponding data latch does not need to be programmed. When all of the data latches are storing logic "1," the state machine (via the wired-OR type mechanism described above) knows that all selected storage elements have been programmed. In step 1940, a check is made as to whether all of the data latches are storing logic "1." If all of the data latches are storing logic "1," the programming process is complete and successful because all selected storage elements were programmed and verified. A status of "PASS" is reported in step 1945. In some embodiments, the programming process is considered complete and successful even if not all selected storage elements were verified as being programmed. In such a case, errors during subsequent read operations can occur due to insufficient programmed storage elements. However, these errors can be corrected by an ECC decoding engine.

If, in step 1940, it is determined that not all of the data latches are storing logic "1," then the programming process continues. In some embodiments, the program process stops even if not all of the data latches are storing logic "1". In step 1950, the program counter PC is checked against a program limit value PCmax. One example of a program limit value is twenty; however, other numbers can also be used. If the program counter PC is not less than PCmax, then the program process has failed and a status of "FAIL" is reported in step 1955. If the program counter PC is less than PCmax, then $V_{PGM}$ is increased by the step size and the program counter PC is incremented in step 1960. The process then loops back to step 1925 to apply the next $V_{PGM}$ pulse.

FIG. 20 depicts an example pulse train 2000 applied to the control gates of non-volatile storage elements during programming. The pulse train 2000 includes a series of program pulses 2005, 2010, 2015, 2020, 2025, 2030, 2035, 2040, 2045, 2050, . . . , that are applied to a word line selected for programming in successive cycles of a program operation. In one embodiment, the programming pulses have a voltage, $V_{PGM}$, which starts at 12 V and increases by increments, e.g., 0.5 V, for each successive programming pulse until a maximum of, e.g., 20-25 V is reached. In between the program pulses are verify pulses, e.g., three verify pulses. In some embodiments, there can be a verify pulse for each state that data is being programmed into, e.g., state A, B and C. In other embodiments, there can be more or fewer verify pulses. The verify pulses in each set can have amplitudes of Vva, Vvb and Vvc (FIG. 17) or Vvb' (FIG. 18*a*), for instance. A program pulse and a series of verify pulses constitute a program cycle.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for operating non-volatile storage, comprising:
    programming at least one selected storage element in a set of storage elements, including performing a verify operation which involves applying a verify voltage to a control gate of the at least one selected storage element while applying a first pass voltage to respective control gates of unselected storage elements which are connected in series with the at least one selected storage element and which are in an unprogrammed or only partly programmed state;
    programming the unselected storage elements; and
    reading the at least one selected storage element, including applying a read compare voltage to the control gate of the at least one selected storage element while applying a second pass voltage, lower than the first pass voltage, to the unselected storage elements, the at least one selected storage element and the unselected storage elements are provided in a NAND string.

2. The method of claim 1, further comprising:
    determining an optimized value for a difference between the first and second pass voltages; and
    setting the first and second pass voltages based on the optimized difference.

3. The method of claim 2, wherein:
    the determining the optimized value comprises determining read errors for different values of the difference.

4. The method of claim 2, wherein:
    the determining the optimized value comprises determining a metric regarding threshold voltage distribution widths for different values of the difference.

5. The method of claim 1, further comprising:
    during the verify operation of the at least one selected storage element, applying the first pass voltage to respective control gates of additional unselected storage elements which are connected in series with the at least one selected storage element and which are in a programmed state; and
    during the reading of the at least one selected storage element, applying the second pass voltage to the additional unselected storage elements.

6. The method of claim 5, wherein:
    the unselected storage elements which are in the unprogrammed or only partly programmed state are on a drain side of the at least one selected storage element; and
    the additional unselected storage elements which are in the programmed state are on a source side of the at least one selected storage element.

7. The method of claim 6, wherein:
    during the verify operation of the at least one selected storage element, the first pass voltage is applied to at least 80% of all storage elements which are connected in series with the at least one selected storage element and which are on the drain side, and the second pass voltage is applied to at least 80% of all storage elements which are connected in series with the at least one selected storage element and which are on the source side; and during the reading, the second pass voltage is applied to at least 80% of all storage elements which are connected in series with the at least one selected storage element and which are on the drain side and at least 80% of all storage elements which are connected in series with the at least one selected storage element and which are on the source side.

8. The method of claim 1, further comprising:

during the verify operation and the reading of the at least one selected storage element, applying a common pass voltage to respective control gates of the unselected storage elements.

9. A method for operating non-volatile storage, comprising:

programming at least one selected storage element in a set of storage elements, including performing a verify operation which involves applying a verify voltage to a control gate of the at least one selected storage element while applying a first pass voltage to respective control gates of unselected storage elements which are connected in series with the at least one selected storage element and which are in a programmed state;

reading the at least one selected storage element, including applying a read compare voltage to the control gate of the at least one selected storage element while applying a second pass voltage, lower than the first pass voltage, to the unselected storage elements; and during the verify operation and the reading of the at least one selected storage element, applying a common pass voltage to respective control gates of the unselected storage elements.

10. A method for operating non-volatile storage, comprising:

programming a first selected storage element in a NAND string, including performing a verify operation which involves applying a verify voltage to a control gate of the first selected storage element while applying a first common pass voltage to respective control gates of unselected storage elements in the NAND string on source and drain sides of the first selected storage element;

subsequently programming a second selected storage element in the NAND string, including performing a verify operation which involves applying a verify voltage to a control gate of the second selected storage element while applying the first common pass voltage to respective control gates of unselected storage elements in the NAND string on source and drain sides of the second selected storage element;

reading the first selected storage element, including applying a read compare voltage to the control gate of the first selected storage element while applying a second common pass voltage, lower than the first common pass voltage, to respective control gates of unselected storage elements in the NAND string on source and drain sides of the first selected storage element; and reading the second selected storage element, including applying a read compare voltage to the control gate of the second selected storage element while applying the second common pass voltage to respective control gates of unselected storage elements in the NAND string on source and drain sides of the second selected storage element, the NAND string has n storage elements arranged between a source side select gate and a drain side select gate, the first storage element is within n/4 storage elements of the source side select gate and the second storage element is within n/4 storage elements of the drain side select gate.

11. The method of claim 10, wherein:

during the verify operation of the first selected storage element, the first common pass voltage is applied to at least 80% of all unselected storage elements in the NAND string which are on the source side of the first selected storage element and at least 80% of all unselected storage elements in the NAND string which are on the drain side of the first selected storage element;

during the verify operation of the second selected storage element, the first common pass voltage is applied to at least 80% of all unselected storage elements in the NAND string which are on the source side of the second selected storage element and at least 80% of all unselected storage elements in the NAND string which are on the drain side of the second selected storage element;

during the reading of the first selected storage element, the second common pass voltage is applied to at least 80% of all unselected storage elements in the NAND string which are on the source side of the first selected storage element and at least 80% of all unselected storage elements in the NAND string which are on the drain side of the first selected storage element; and during the reading of the second selected storage element, the second common pass voltage is applied to at least 80% of all unselected storage elements in the NAND string which are on the source side of the second selected storage element and at least 80% of all unselected storage elements in the NAND string which are on the drain side of the second selected storage element.

12. A method for operating non-volatile storage, comprising:

programming at least one selected storage element in a set of storage elements, including performing a verify operation which involves applying a verify voltage to a control gate of the at least one selected storage element while applying a first pass voltage to respective control gates of unselected storage elements which are connected in series with the at least one selected storage element and which are in a programmed state;

reading the at least one selected storage element, including applying a read compare voltage to the control gate of the at least one selected storage element while applying a second pass voltage, lower than the first pass voltage, to the unselected storage elements;

determining an optimized value for a difference between the first and second pass voltages; and setting the first and second pass voltages based on the optimized difference.

13. The method of claim 12, wherein:

the determining the optimized value comprises determining read errors for different values of the difference.

14. The method of claim 12, wherein:

the determining the optimized value comprises determining a metric regarding threshold voltage distribution widths for different values of the difference.

15. A method for operating non-volatile storage, comprising:

programming at least one selected storage element in a set of storage elements, including performing a verify operation which involves applying a verify voltage to a control gate of the at least one selected storage element while applying a first pass voltage to respective control gates of unselected storage elements which are connected in series with the at least one selected storage element and which are in a programmed state and while applying a second pass voltage, lower than the first pass voltage, to respective control gates of additional unselected storage elements which are connected in series with the at least one selected storage element and which are in an unprogrammed or only partly programmed state;

programming the additional unselected storage elements; and reading the at least one selected storage element, including applying a read compare voltage to the control gate of the at least one selected storage element while applying the second pass voltage to the unselected storage elements and to the additional unselected storage elements.

16. The method of claim 15, wherein:

the unselected storage elements which are connected in series with the at least one selected storage element and which are in the programmed state when the at least one selected storage element is being programmed are on a source side of the at least one selected storage element; and the additional unselected storage elements which are connected in series with the at least one selected storage element and which are in the unprogrammed or only partly programmed state when the at least one selected storage element is being programmed are on a drain side of the at least one selected storage element.

17. The method of claim 16, wherein:

during the verify operation of the at least one selected storage element, the first pass voltage is applied to at least 80% of all storage elements which are connected in series with the at least one selected storage element and which are on the source side, and the second pass voltage is applied to at least 80% of all storage elements which are connected in series with the at least one selected storage element and which are on the drain side; and during the reading, the second pass voltage is applied to at least 80% of all storage elements which are connected in series with the at least one selected storage element and which are on the source side and at least 80% of all storage elements which are connected in series with the at least one selected storage element and which are on the drain side.

18. A non-volatile storage system, comprising:

a set of storage elements comprising a NAND string, the NAND comprising at least one selected storage element and unselected storage elements which are connected in series with the at least one selected storage element and which are in an unprogrammed or only partly programmed state; and one or more managing circuits, the one or more managing circuits:

to program the at least one selected storage element, perform a verify operation which involves applying a verify voltage to a control gate of the at least one selected storage element while applying a first pass voltage to respective control gates of the unselected storage elements;

program the unselected storage elements; and to read the at least one selected storage element, apply a read compare voltage to the control gate of the at least one selected storage element while applying a second pass voltage, lower than the first pass voltage, to the unselected storage elements.

* * * * *